United States Patent
Park et al.

(10) Patent No.: US 11,948,903 B2
(45) Date of Patent: Apr. 2, 2024

(54) SEMICONDUCTOR PACKAGE

(71) Applicant: SAMSUNG ELECTRONICS CO., LTD., Suwon-si (KR)

(72) Inventors: Sang-Sick Park, Hwaseong-si (KR); Un-Byoung Kang, Hwaseong-si (KR); Seon Gyo Kim, Asan-si (KR); Joon Ho Jun, Cheonan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/119,397

(22) Filed: Mar. 9, 2023

(65) Prior Publication Data

US 2023/0223373 A1    Jul. 13, 2023

Related U.S. Application Data

(63) Continuation of application No. 17/220,299, filed on Apr. 1, 2021, now Pat. No. 11,616,039.

(30) Foreign Application Priority Data

Jun. 25, 2020 (KR) .................. 10-2020-0078062

(51) Int. Cl.
*H01L 23/48* (2006.01)
*H01L 23/00* (2006.01)
(Continued)

(52) U.S. Cl.
CPC ............ *H01L 24/17* (2013.01); *H01L 23/481* (2013.01); *H01L 24/06* (2013.01); *H01L 24/13* (2013.01);
(Continued)

(58) Field of Classification Search
CPC ...................................... H01L 24/17
See application file for complete search history.

(56) References Cited

U.S. PATENT DOCUMENTS 5,872,399 A * 2/1999 Lee .................. H01L 23/49816
257/737
5,995,379 A    11/1999 Kyougoku et al.
(Continued)

FOREIGN PATENT DOCUMENTS

JP    2001-313365 A    11/2001
JP    2010-206021 A    9/2010
(Continued)

OTHER PUBLICATIONS

Indian Office action dated Mar. 15, 2022.

*Primary Examiner* — William A Harriston
(74) *Attorney, Agent, or Firm* — Muir Patent Law, PLLC

(57) ABSTRACT

A semiconductor package including a first stack; a plurality of TSVs passing through the first stack; a second stack on the first stack and including a second surface facing a first surface of the first stack; a first pad on the first stack and in contact with the TSVs; a second pad on the second stack; a bump connecting the first and second pads; a first redundancy pad on the first surface of the first stack, spaced apart from the first pad, and not in contact with the TSVs; a second redundancy pad on the second surface of the second stack and spaced apart from the second pad; and a redundancy bump connecting the first redundancy pad and the second redundancy pad, wherein the first pad and first redundancy pad are electrically connected to each other, and the second pad and second redundancy pad are electrically connected to each other.

20 Claims, 16 Drawing Sheets

(51) Int. Cl.
*H01L 25/065* (2023.01)
*H01L 25/18* (2023.01)

(52) U.S. Cl.
CPC .............. *H01L 24/14* (2013.01); *H01L 24/16* (2013.01); *H01L 24/05* (2013.01); *H01L 24/73* (2013.01); *H01L 25/0657* (2013.01); *H01L 25/18* (2013.01); *H01L 2224/0233* (2013.01); *H01L 2224/02372* (2013.01); *H01L 2224/02375* (2013.01); *H01L 2224/02381* (2013.01); *H01L 2224/0401* (2013.01); *H01L 2224/05024* (2013.01); *H01L 2224/05078* (2013.01); *H01L 2224/05562* (2013.01); *H01L 2224/06158* (2013.01); *H01L 2224/06182* (2013.01); *H01L 2224/13025* (2013.01); *H01L 2224/13082* (2013.01); *H01L 2224/14152* (2013.01); *H01L 2224/1416* (2013.01); *H01L 2224/14181* (2013.01); *H01L 2224/16145* (2013.01); *H01L 2224/16148* (2013.01); *H01L 2224/17107* (2013.01); *H01L 2224/73204* (2013.01); *H01L 2225/06513* (2013.01); *H01L 2225/06544* (2013.01)

(56) References Cited

U.S. PATENT DOCUMENTS

| | | | |
|---|---|---|---|
| 6,179,198 B1 * | 1/2001 | Eifuku | B23K 1/0016 228/103 |
| 6,608,379 B2 | 8/2003 | Yeo et al. | |
| 8,053,900 B2 * | 11/2011 | Yu | H01L 24/05 257/777 |
| 8,680,685 B2 | 3/2014 | Lim et al. | |
| 8,779,588 B2 * | 7/2014 | Yu | H01L 23/49811 257/737 |
| 8,928,141 B2 * | 1/2015 | Souriau | H01L 24/13 257/737 |
| 9,123,552 B2 | 9/2015 | Keeth et al. | |
| 9,406,662 B2 * | 8/2016 | Marion | H01L 24/29 |
| 9,431,322 B2 | 8/2016 | Koyanagi | |
| 9,520,381 B2 * | 12/2016 | Higuchi | H01L 24/13 |
| 9,893,037 B1 | 2/2018 | Lin et al. | |
| 10,192,852 B2 * | 1/2019 | Chandolu | H01L 25/50 |
| 10,431,547 B2 | 10/2019 | Nam et al. | |
| 10,957,616 B2 | 3/2021 | Lin et al. | |
| 2002/0016022 A1 * | 2/2002 | Shintani | H01L 23/49838 257/E21.511 |
| 2002/0034066 A1 | 3/2002 | Huang et al. | |
| 2005/0099783 A1 * | 5/2005 | Alcoe | H01L 24/17 361/748 |
| 2007/0018299 A1 | 1/2007 | Koo et al. | |
| 2007/0152692 A1 | 7/2007 | Kinsley | |
| 2007/0290300 A1 | 12/2007 | Kawakami | |
| 2009/0115050 A1 | 5/2009 | Kasuya et al. | |
| 2011/0278736 A1 | 11/2011 | Lin et al. | |
| 2015/0179545 A1 | 6/2015 | Jeong et al. | |
| 2015/0228583 A1 | 8/2015 | Karhade et al. | |
| 2018/0184524 A1 | 6/2018 | Xiong | |
| 2019/0013301 A1 | 1/2019 | Cheah et al. | |
| 2020/0098730 A1 | 3/2020 | Keeth | |

FOREIGN PATENT DOCUMENTS

JP 2018-026485 A 2/2018
KR 10-1307490 B1 9/2013

* cited by examiner

FIG. 9
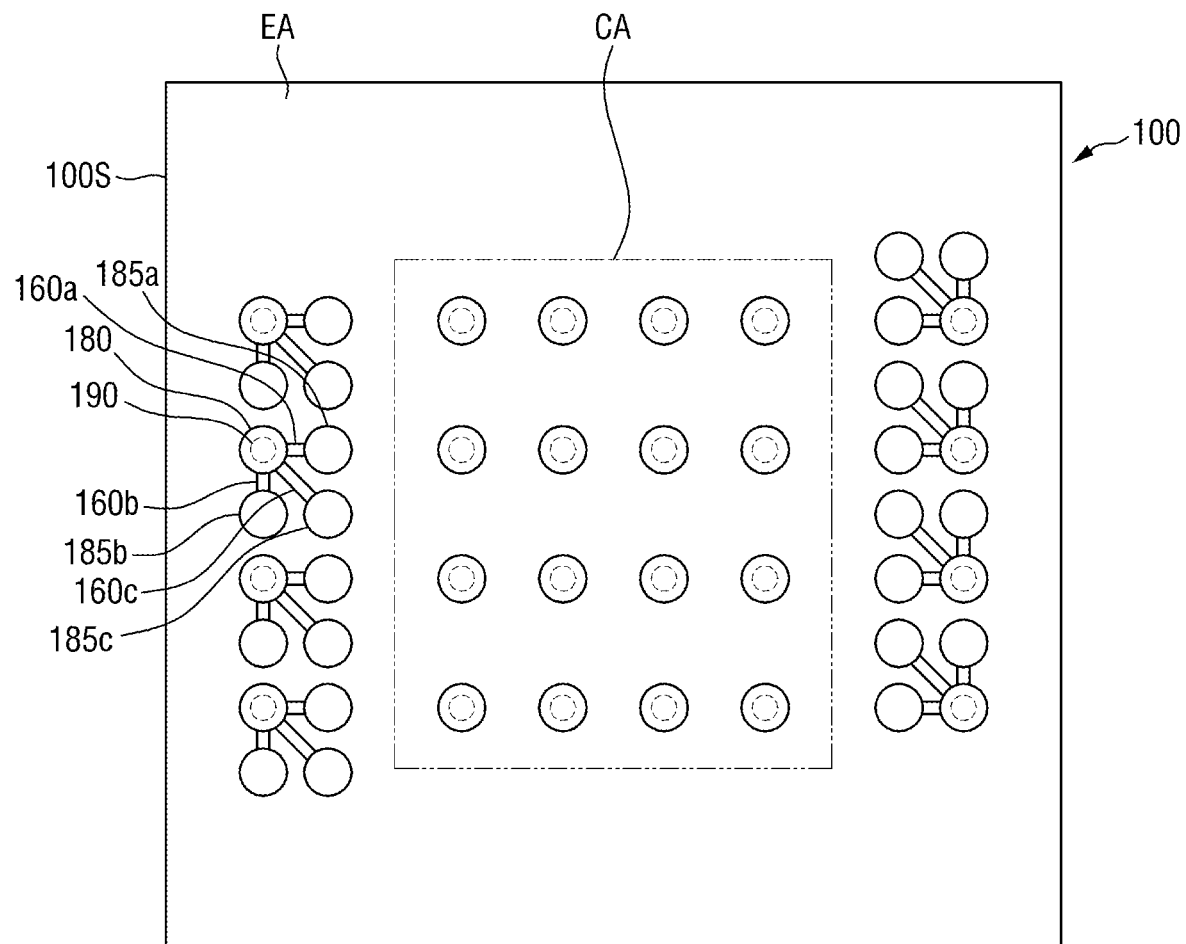
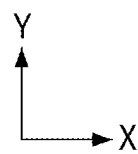

US 11,948,903 B2

SEMICONDUCTOR PACKAGE

CROSS-REFERENCE TO RELATED APPLICATIONS

This is a continuation application based on pending application Ser. No. 17/220,299, filed Apr. 1, 2021, the entire contents of which is hereby incorporated by reference.

Korean Patent Application No. 10-2020-0078062, filed on Jun. 25, 2020, in the Korean Intellectual Property Office, and entitled: "Semiconductor Package," is incorporated by reference herein in its entirety.

BACKGROUND

1. Field

Embodiments relate to a semiconductor package.

2. Description of the Related Art

With the rapid development of the electronic industry and user demand, electronic devices have become smaller, lighter, and multifunctional. Accordingly, smaller, lighter, and multifunctional semiconductor packages may be used the electronic devices.

SUMMARY

The embodiments may be realized by providing a semiconductor package including a first stack including a first semiconductor substrate; a plurality of through-silicon vias (TSVs) passing through the first semiconductor substrate; a second stack on the first stack, the second stack including a second surface facing a first surface of the first stack; a first pad on the first surface of the first stack, the first pad being in contact with one or more of the plurality of TSVs; a second pad on the second surface of the second stack; a bump connecting the first pad and the second pad; a first redundancy pad on the first surface of the first stack, the first redundancy pad being spaced apart from the first pad and not being in contact with the plurality of TSVs; a second redundancy pad on the second surface of the second stack, the second redundancy pad being spaced apart from the second pad; and a redundancy bump connecting the first redundancy pad and the second redundancy pad, wherein the first pad and the first redundancy pad are electrically connected to each other, and the second pad and the second redundancy pad are electrically connected to each other.

The embodiments may be realized by providing a semiconductor package including a first stack including a center area and an edge area around the center area, the first stack including a first semiconductor substrate; a plurality of through-silicon vias (TSVs) passing through the first semiconductor substrate; one or more first pads on a top surface of the edge area of the first stack, the one or more first pads being in contact with one or more of the plurality of TSVs; one or more first redundancy pads on the top surface of the edge area of the first stack, the one or more first redundancy pads being spaced apart from the one or more first pads and not being in contact with the plurality of TSVs; and one or more first interconnection lines extending along the top surface of the edge area of the first stack to electrically connect the one or more first pads and the one or more first redundancy pads.

The embodiments may be realized by providing a semiconductor package including a first semiconductor chip including a first semiconductor substrate and a first semiconductor device layer on a bottom surface of the first semiconductor substrate; a second semiconductor chip including a second semiconductor substrate and a second semiconductor device layer on a bottom surface of the second semiconductor substrate, on the first semiconductor chip; a plurality of first through-silicon vias (TSVs) passing through the first semiconductor substrate; a first pad on a top surface of the first semiconductor substrate, the first pad being in contact with one or more of the plurality of first TSVs; a second pad on a bottom surface of the second semiconductor device layer; a bump connecting the first pad and the second pad; a first redundancy pad on the top surface of the first semiconductor substrate, the first redundancy pad being spaced apart from the first pad and not being in contact with the plurality of first TSVs; an interconnection line extending along the top surface of the first semiconductor substrate and connecting the first pad and the first redundancy pad; a second redundancy pad on the bottom surface of the second semiconductor device layer, the second redundancy pad being spaced apart from the second pad; and a redundancy bump connecting the first redundancy pad and the second redundancy pad, wherein the second semiconductor device layer electrically connects the second pad and the second redundancy pad.

BRIEF DESCRIPTION OF THE DRAWINGS

Features will be apparent to those of skill in the art by describing in detail exemplary embodiments with reference to the attached drawings in which:

FIGS. 6 to 11 are layout diagrams of semiconductor packages according to some embodiments.

DETAILED DESCRIPTION

Although first, second, and the like are used herein to describe various elements or components, it is to be understood that these elements or components are not limited by these terms. These terms are only used to distinguish one element or component from another element or component, and are not intended to require sequential inclusion of the elements. Accordingly, it is to be understood that a first element or component described below may be a second element or a component within the technical spirit of the present disclosure.

Hereinafter, a semiconductor package according to some embodiments will be described with reference to FIGS. 1 to 3.

Figure 1:
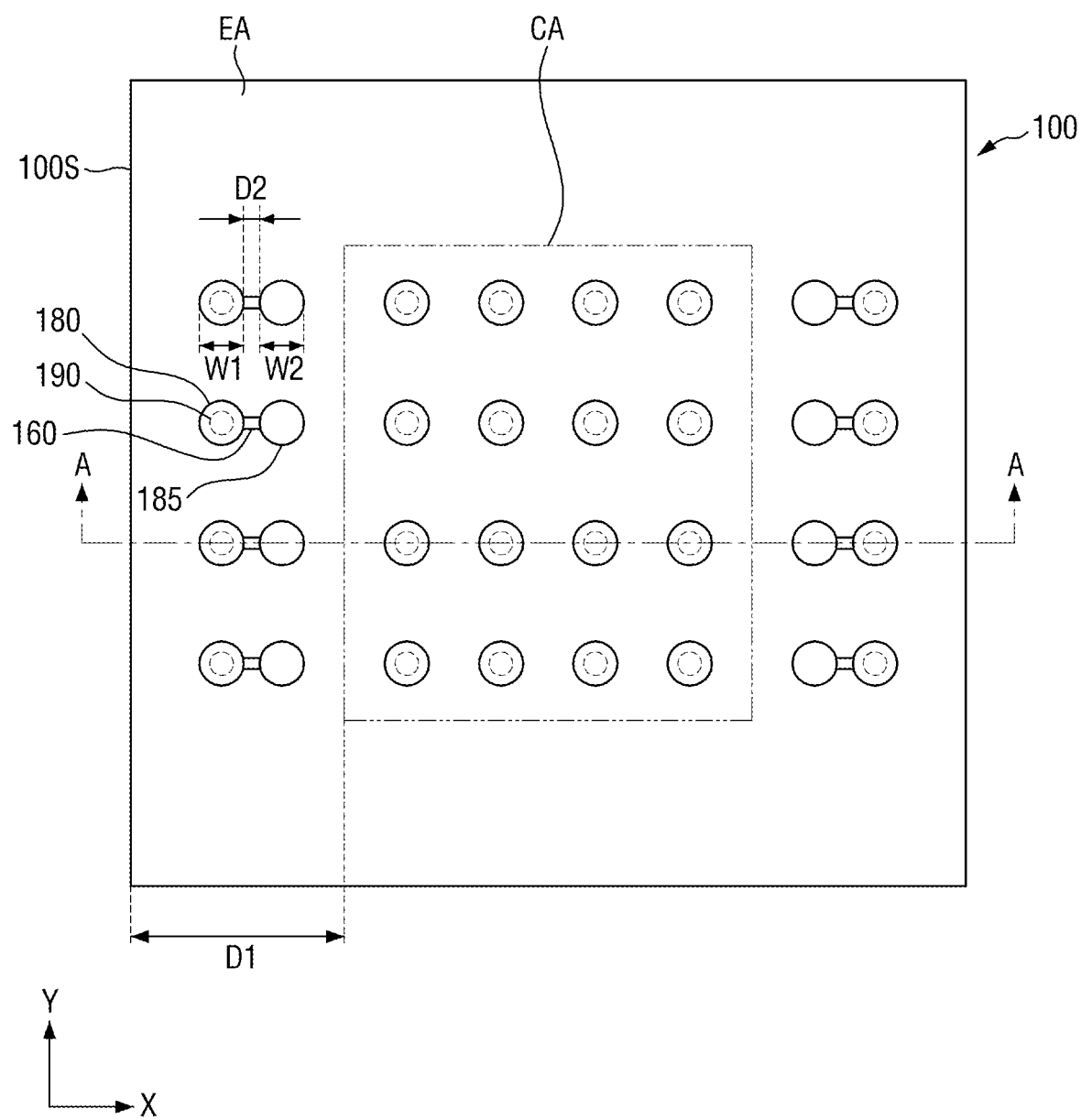
FIG. 1 is a layout diagram of a semiconductor package according to some embodiments.

FIG. 1 is a layout diagram of a semiconductor package according to some embodiments. FIG. 2 is a cross-sectional view taken along line A-A of FIG. 1. FIG. 3 is an enlarged view for describing region R1 of FIG. 2.

Figure 2:
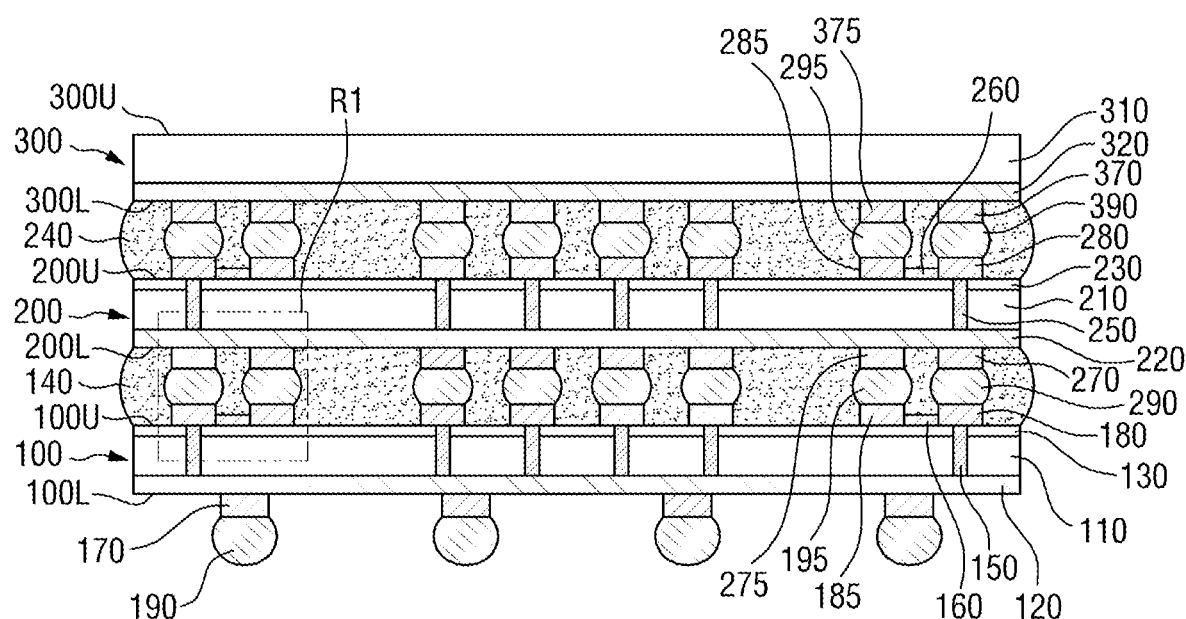
FIG. 2 is a cross-sectional view taken along line A-A of FIG. 1.
Figure 3:
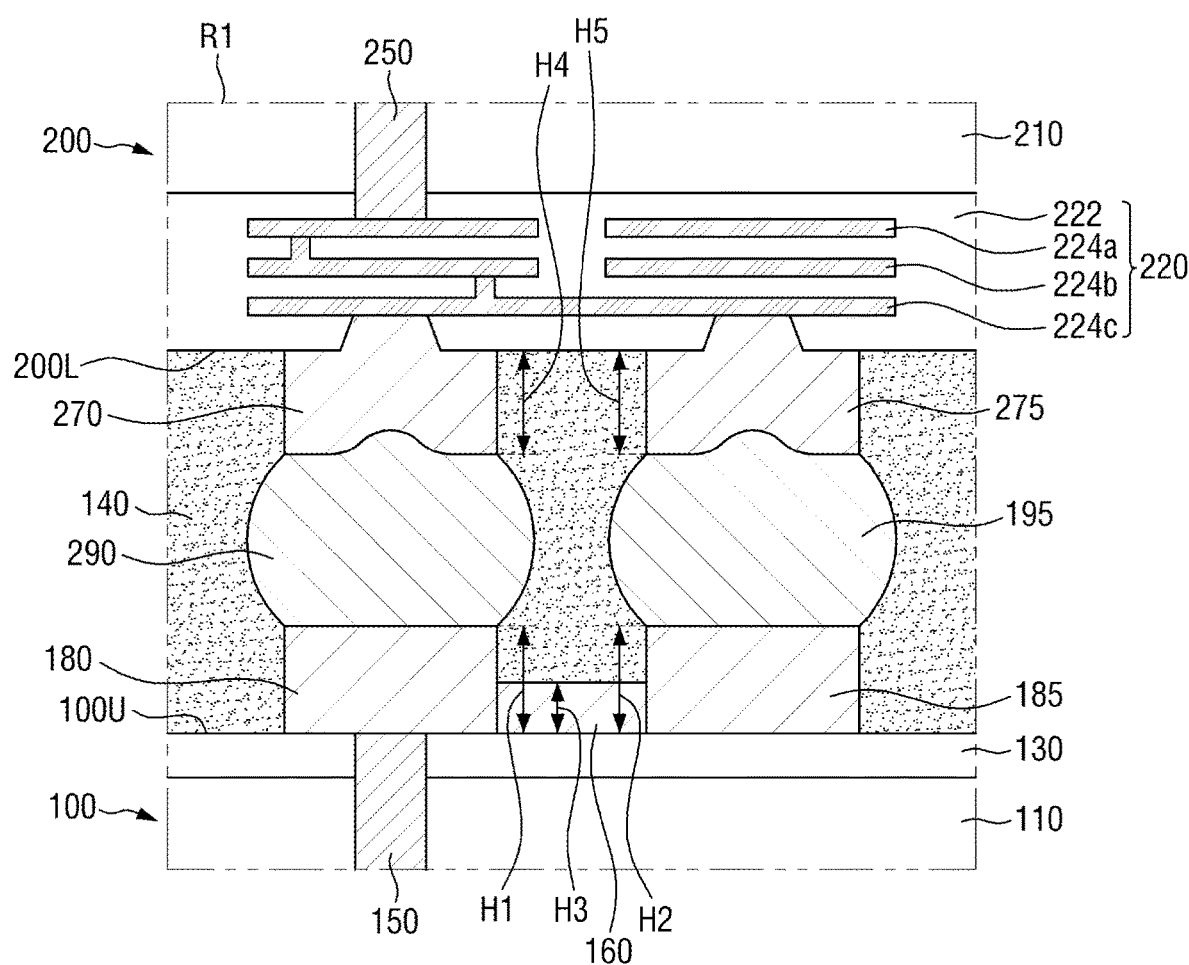
FIG. 3 is an enlarged view for describing region R1 of FIG. 2.

Referring to FIGS. 1 to 3, the semiconductor package according to some embodiments may include a first stack 100, a second stack 200, a plurality of first through-silicon vias (TSVs) 150, a first pad 180, a second pad 270, a first bump 290, a first redundancy pad 185, a second redundancy pad 275, and a first redundancy bump 195.

The first stack 100 may include a center area CA and an edge area EA. In an implementation, as illustrated in FIG. 1, the edge area EA may be around the center area CA and constitute an edge of the first stack 100. In an implementation, the first stack 100 may include an edge surface 100S that extends (e.g., lengthwise) in a second direction Y. The edge area EA may be defined as an area spaced apart (e.g., inwardly) from the edge surface 100S by a predetermined distance, e.g., in a first direction X (intersecting the second direction Y). In an implementation, a distance D1 at which the edge area EA is spaced apart from the edge surface 100S (e.g., a width of the edge area EA in the first direction X) may be less than or equal to about 200 µm.

The first stack 100 may include a first surface 100L and a second surface 100U that are opposite to each other. In an implementation, as illustrated in FIG. 2, the first surface 100L may be a bottom surface of the first stack 100, and the second surface 100U may be a top surface of the first stack 100.

The second stack 200 may be stacked on the first stack 100. The second stack 200 may include a third surface 200L and a fourth surface 200U that are opposite to each other. The third surface 200L of the second stack 200 may face the second surface 100U of the first stack 100. In an implementation, the third surface 200L may be a bottom surface of the second stack 200, and the fourth surface 200U may be a top surface of the second stack 200.

Each of the first stack 100 and the second stack 200 may be a substrate constituting or of the semiconductor package. In an implementation, each of the first stack 100 and the second stack 200 may be, e.g., a printed circuit board (PCB), a ceramic substrate, or an interposer. In an implementation, each of the first stack 100 and the second stack 200 may be a semiconductor chip including a semiconductor device. In an implementation, as discussed below, the first stack 100 and the second stack 200 may be being semiconductor chips.

In an implementation, the first stack 100 may include a first semiconductor substrate 110 and a first semiconductor device layer 120, and the second stack 200 may include a second semiconductor substrate 210 and a second semiconductor device layer 220.

Each of the first semiconductor substrate 110 and the second semiconductor substrate 210 may be, e.g., a bulk silicon substrate or a silicon-on-insulator (SOI) substrate. In an implementation, each of the first semiconductor substrate 110 and the second semiconductor substrate 210 may be a silicon substrate or may include other materials such as silicon germanium, silicon germanium-on-insulator (SGOI), indium antimonide, lead tellurium compounds, indium arsenide, indium phosphide, gallium arsenide, or gallium antimonide. As used herein, the term "or" is not an exclusive term, e.g., "A or B" would include A, B, or A and B.

The first semiconductor device layer 120 may be on the first semiconductor substrate 110, and the second semiconductor device layer 220 may be on the second semiconductor substrate 210. In an implementation, the first semiconductor device layer 120 may cover a bottom surface of the first semiconductor substrate 110, and the second semiconductor device layer 220 may cover a bottom surface of the second semiconductor substrate 210. In an implementation, a bottom surface of the first semiconductor device layer 120 may constitute the first surface 100L of the first stack 100, and a bottom surface of the second semiconductor device layer 220 may constitute the third surface 200L of the second stack 200.

Each of the first semiconductor device layer 120 and the second semiconductor device layer 220 may include a plurality of various kinds of individual devices and an inter-line insulating film. The plurality of individual devices may include various microelectronic devices, e.g., a metal-oxide-semiconductor field-effect transistor (MOSFET) such as a complementary metal-oxide-semiconductor (CMOS) transistor, a system large scale integration (LSI), a flash memory, a dynamic random access memory (DRAM), a static random access memory (SRAM), an electrically erasable programmable read-only memory (EEPROM), a phase-change random access memory (PRAM), a magnetoresistive random access memory (MRAM), a resistance random access memory (RRAM), an image sensor such as a CMOS imaging sensor (CIS), a micro-electro-mechanical system (MEMS), an active device, or a passive device.

In an implementation, a first protective layer 130 may be on the first semiconductor substrate 110, and a second protective layer 230 may be on the second semiconductor substrate 210. In an implementation, the first protective layer 130 may cover a top surface of the first semiconductor substrate 110, and the second protective layer 230 may cover a top surface of the second semiconductor substrate 210. In an implementation, a top surface of the first protective layer 130 may constitute the second surface 100U of the first stack 100, and a top surface of the second protective layer 230 may constitute the fourth surface 200U of the second stack 200.

Each of the first protective layer 130 and the second protective layer 230 may include a non-conductive film (NCF). In an implementation, each of the first protective layer 130 and the second protective layer 230 may include an insulating polymer. In an implementation, the first protective layer 130 and the second protective layer 230 may be formed, e.g., by a spin coating process or a spray process.

In an implementation, a base pad 170 and a base bump 190 may be on the first surface 100L of the first stack 100. A plurality of base pads 170 may be on the first surface 100L of the first stack 100. Each of the base pads 170 may be electrically connected to the first semiconductor device layer 120. The base bump 190 may be connected to the base pad 170. The base bump 190 may have various shapes, e.g., a pillar structure, a ball structure, or a solder layer.

The plurality of first TSVs 150 may pass through the first semiconductor substrate 110. In an implementation, each of the first TSVs 150 may be exposed from or at the second surface 100U of the first stack 100, passing through the first semiconductor substrate 110 and the first protective layer 130. Each of the first TSVs 150 may have a columnar shape extending in a third direction Z, e.g., a direction intersecting the first surface 100L and the second surface 100U.

A plurality of second TSVs 250 may pass through the second semiconductor substrate 210. In an implementation, each of the second TSVs 250 may be exposed from or at the fourth surface 200U of the second stack 200 and may pass through the second semiconductor substrate 210 and the second protective layer 230. Each of the second TSVs 250 may have a columnar shape extending in the third direction Z, the direction intersecting the third surface 200L and the fourth surface 200U.

In an implementation, the first TSVs 150 may be connected to the first semiconductor device layer 120 through the first semiconductor substrate 110, and the second TSVs 250 may be connected to the second semiconductor device layer 220 through the second semiconductor substrate 210. In an implementation, as illustrated in FIG. 3, the second semiconductor device layer 220 may include a first inter-line insulating film 222 and first lines 224a, 224b, and 224c in the first inter-line insulating film 222. The first lines 224a, 224b, and 224c may be sequentially stacked from the bottom surface of the second semiconductor substrate 210. The second TSV 250 may be electrically connected to the second semiconductor device layer 220 through the first lines 224a, 224b, and 224c.

In an implementation, the second TSV 250 may be in contact (e.g., direct contact) with an uppermost line 224a of the first lines 224a, 224b, and 224c. The uppermost line 224a of the second semiconductor device layer 220 may be a line closest or proximate to the second semiconductor substrate 210 (e.g., in the third direction Z) among the first lines 224a, 224b, and 224c.

In an implementation, each of the first TSV 150 and the second TSV 250 may include a barrier film on a surface of the columnar shape and a buried conductive layer that is filled in the barrier film. The barrier film may include, e.g., titanium (Ti), titanium nitride (TiN), tantalum (Ta), tantalum nitride (TaN), ruthenium (Ru), cobalt (Co), manganese (Mn), tungsten nitride (WN), nickel (Ni), or nickel boron (NiB). The buried conductive layer may include, e.g., copper (Cu), a Cu alloy such as copper-tin (CuSn), copper-magnesium (CuMg), copper-nickel (CuNi), copper-zinc (CuZn), copper-palladium (CuPd), copper-gold (CuAu), copper-rhenium (CuRe), or copper-tungsten (CuW), tungsten (W), a W alloy, Ni, Ru, or Co.

In an implementation, an insulating film may be between the first semiconductor substrate 110 and the first TSV 150 and between the second semiconductor substrate 210 and the second TSV 250. The insulating film may include, e.g., an oxide film, a nitride film, a carbide film, a polymer, or a combination thereof.

A plurality of first pads 180 may be on the second surface 100U of the first stack 100. Each of the first pads 180 may be in contact (e.g., direct contact) with at least one of the plurality of first TSVs 150. In an implementation, the first pad 180 may be on the first protective layer 130 and may be in contact with the first TSV 150 that is exposed through the first protective layer 130.

In an implementation, a width W1 of the first pad 180 (e.g., in the first direction X) may be in a range of 15 μm to 30 μm.

A plurality of second pads 270 may be on the third surface 200L of the second stack 200. Each of the second pads 270 may be electrically connected to the second semiconductor device layer 220. In an implementation, the second pad 270 may be electrically connected to the individual devices of the second semiconductor device layer 220 or the second TSV 250.

Each of the first pad 180 and the second pad 270 may include, e.g., aluminum (Al), Cu, Ni, W, platinum (Pt), gold (Au), or combinations thereof.

The first bump 290 may be between the first pad 180 and the second pad 270. The first bump 290 may have various shapes, e.g., a pillar structure, a ball structure, or a solder layer.

The first bump 290 may electrically connect the first pad 180 and the second pad 270. In an implementation, the first stack 100 and the second stack 200 may be electrically connected. In an implementation, the first semiconductor device layer 120 may be electrically connected to the second semiconductor device layer 220 or the second TSV 250 through the first TSV 150, the first pad 180, the first bump 290, and the second pad 270.

The first redundancy pad 185 may be on the second surface 100U of the first stack 100. The first redundancy pad 185 may be spaced apart from the first pad 180 (e.g., in the first direction X). In an implementation, the first redundancy pad 185 may not be in contact with the plurality of first TSVs 150. In an implementation, the first protective layer 130 may completely cover a bottom (e.g., first stack 100-facing) surface of the first redundancy pad 185.

The first redundancy pad 185 may include, e.g., Al, Cu, Ni, W, Pt, Au, and combinations thereof. In an implementation, the first redundancy pad 185 may be at the same level as the first pad 180. The term "the same level" as used herein means being formed by the same manufacturing process (e.g., formed at the same time with the same material(s)).

The first redundancy pad 185 may be electrically connected to at least one of the plurality of first pads 180. In an implementation, the first pad 180 and the first redundancy pad 185 may be electrically connected by a first interconnection line 160. The first interconnection line 160 may extend along the second surface 100U of the first stack 100 (e.g., in the first direction X). In an implementation, the first interconnection line 160 may extend along the top surface of the first protective layer 130 to electrically connect the first pad 180 and the first redundancy pad 185. In an implementation, the first interconnection line 160 may be a redistribution layer (RDL) on the second surface 100U of the first stack 100.

In an implementation, the first redundancy pad 185 may be on the edge area EA. The first redundancy pad 185 on the edge area EA may be electrically connected to the first pad 180 on the edge area EA. In an implementation, as illustrated in FIG. 1, the first pad 180 and the first redundancy pad 185 may be arranged to be adjacent to each other in (e.g., aligned along) the first direction X on the edge area EA. The first interconnection line 160 may extend (e.g., lengthwise) in the first direction X on the edge area EA to connect the first pad 180 and the first redundancy pad 185.

In an implementation, a width W2 of the first redundancy pad 185 (e.g., in the first direction X) may be in a range of about 15 μm to about 30 μm. In an implementation, the width W2 of the first redundancy pad 185 may be identical to a width W1 of the first pad 180. The term "identical to" as used herein includes a meaning of a slight difference that may occur due to the margin or the like on the process, as well as being completely identical to.

In an implementation, a distance D2 at which the first pad 180 and the first redundancy pad 185 are spaced apart from each other may be in a range of about 3 μm to about 8 μm. Maintaining the distance D2 at which the first pad 180 and the first redundancy pad 185 are spaced apart from each other at about 3 μm or greater may help ensure that the first redundancy pad 185 is not too close to the first TSV 150, thereby avoiding a non-wetting failure of the bump, which will be described below. Maintaining the distance D2 at which the first pad 180 and the first redundancy pad 185 are spaced apart from each other at about 8 μm or less may help prevent an electrical connection failure between the first pad 180 and the first redundancy pad 185.

In an implementation, the first interconnection line 160 may be lower or shorter than the first pad 180 and the second pad 270 (e.g., as measured in the third direction Z). In an implementation, as illustrated in FIG. 3, a height H1 of the first pad 180 and a height H2 of the first redundancy pad 185 may be greater than a height H3 of the first interconnection line 160, on the basis of or as measured from the second surface 100U of the first stack 100 in the third direction Z.

In an implementation, the height H2 of the first redundancy pad 185 may be identical to the height H1 of the first pad 180.

In an implementation, the first interconnection line 160 may be in contact (e.g., direct contact) with a side surface of the first pad 180 and a side surface of the first redundancy pad 185.

The second redundancy pad 275 may be on the third surface 200L of the second stack 200. The second redundancy pad 275 may include, e.g., Al, Cu, Ni, W, Pt, Au, or combinations thereof. In an implementation, the second redundancy pad 275 may be at the same level as the second pad 270.

The second redundancy pad 275 may be electrically connected to at least one of the plurality of second pads 270. In an implementation, the second pad 270 and the second redundancy pad 275 may be electrically connected by the second semiconductor device layer 220. In an implementation, as illustrated in FIG. 3, the second pad 270 and the second redundancy pad 275 may be electrically connected by the first lines 224a, 224b, and 224c of the second semiconductor device layer 220.

In an implementation, the second pad 270 and the second redundancy pad 275 may be electrically connected by a lowermost line 224c of the first lines 224a, 224b, and 224c. The lowermost line 224c of the second semiconductor device layer 220 may be a line closest to the third surface 200L of the second stack 200 among the first lines 224a, 224b, and 224c (e.g., along the third direction Z). The second pad 270 and the second redundancy pad 275 may each be connected to the lowermost line 224c of the second semiconductor device layer 220 to be electrically connected to each other. In an implementation, a trench exposing the lowermost line 224c may be in the first inter-line insulating film 222. The second pad 270 and the second redundancy pad 275 may fill the trench.

In an implementation, a height H5 of the second redundancy pad 275 may be identical to the height H2 of the second pad 270 (e.g., as measured in the third direction Z).

The first redundancy bump 195 may be between the first redundancy pad 185 and the second redundancy pad 275. The first redundancy bump 195 may have various shapes, e.g., a pillar structure, a ball structure, or a solder layer. In an implementation, the first redundancy bump 195 may be at the same level as the first bump 290.

The first redundancy bump 195 may electrically connect the first redundancy pad 185 and the second redundancy pad 275. In an implementation, the first stack 100 and the second stack 200 may be electrically connected to each other. In an implementation, the first semiconductor device layer 120 may be electrically connected to the second semiconductor device layer 220 or the second TSV 250 through the first TSV 150, the first pad 180, the first interconnection line 160, the first redundancy pad 185, the first redundancy bump 195, the second redundancy pad 275, and the first lines 224a, 224b, and 224c.

In an implementation, the first redundancy bump 195 may be spaced apart from the first bump 290 (e.g., in the first direction X). In an implementation, the first bump 290 and the first redundancy bump 195 may not be in contact with each other.

In a semiconductor chip (e.g., the first stack 100 or the second stack 200) in which a TSV (e.g., the first TSV 150) is formed and a multi-chip semiconductor package in which a plurality of the semiconductor chips are stacked, pads (e.g., the first pad 180 and the second pad 270) and a bump (e.g., the first bump 290) that are connected to the TSV may interconnect the semiconductor chips. In a process of forming the bump on the pad, the TSV could function as a heat transfer path, which could cause a bump failure. For example, the bump could be formed through a thermal compression bonding process to interconnect the pads of the semiconductor chips. The pad in contact with the TSV may have a low temperature in the thermal compression bonding process to cause a non-wetting failure of the bump. Such a failure could be more severe in an edge area of the semiconductor chip.

The semiconductor package according to some embodiments may help prevent the failure by including the first redundancy pad 185 and the first redundancy bump 195. In an implementation, the first redundancy pad 185 may be not in contact (e.g., direct contact) with the first TSV 150, and a non-wetting failure of the first redundancy bump 195 due to the first TSV 150 may be prevented. In an implementation, the first redundancy pad 185 may be electrically connected to the first pad 180 in contact with the first TSV 150, and even if a non-wetting failure were to occur in the first bump 290 on the first pad 180, the electrical connection between the first redundancy pad 185 and the first TSV 150 may be maintained. Accordingly, a semiconductor package having improved product reliability may be provided, e.g., by preventing the failure of the first bump 290.

In the semiconductor package according to some embodiments, the first redundancy pad 185 may be electrically connected to the first pad 180 on the edge area EA. In an implementation, a semiconductor package having improved product reliability may be provided by preventing the failure of the first bump 290 in the edge area EA.

In an implementation, a third stack 300 may be on the second stack 200. The third stack 300 may include a fifth surface 300L and a sixth surface 300U that are opposite to each other. The fifth surface 300L of the third stack 300 may face the fourth surface 200U of the second stack 200. In an implementation, the fifth surface 300L may be a bottom surface of the third stack 300, and the sixth surface 300U may be a top surface of the third stack 300.

In an implementation, the third stack 300 may include a third semiconductor substrate 310 and a third semiconductor device layer 320. The third semiconductor substrate 310 may be similar to the first semiconductor substrate 110 or the second semiconductor substrate 210 described above, and the third semiconductor device layer 320 may be similar to the first semiconductor device layer 120 or the second semiconductor device layer 220 described above, and thus, in the following description, repeated detailed descriptions thereof may be omitted.

In an implementation, the stacked first stack 100, second stack 200, and third stack 300 may constitute a multi-chip semiconductor package such as a high-bandwidth memory (HBM).

In an implementation, a third pad 280, a fourth pad 370, a second bump 390, a third redundancy pad 285, a fourth redundancy pad 375, a second redundancy bump 295, and a second interconnection line 260 may be between the second stack 200 and the third stack 300. The third pad 280, the fourth pad 370, the second bump 390, the third redundancy pad 285, the fourth redundancy pad 375, the second redundancy bump 295, and the second interconnection line 260 may be similar to the first pad 180, the second pad 270, the first bump 290, the first redundancy pad 185, the second redundancy pad 275, the first redundancy bump 195, and the first interconnection line 160, which are described above, respectively. In an implementation, the first pad 180, the second pad 270, the first bump 290, the first redundancy pad 185, the second redundancy pad 275, the first redundancy bump 195, and the first interconnection line 160, which are described above, may be stacked and repeatedly formed over a plurality of stacked stacks.

In an implementation, a first filler layer 140 may be between the first stack 100 and the second stack 200, and a second filler layer 240 may be between the second stack 200 and the third stack 300. The first filler layer 140 may be filled in a space between the first stack 100 and the second stack 200, and the second filler layer 240 may be filled in a space between the second stack 200 and the third stack 300. The first filler layer 140 may cover the first pad 180, the second pad 270, the first bump 290, the first redundancy pad 185, the second redundancy pad 275, the first redundancy bump 195, and the first interconnection line 160. The second filler layer 240 may cover the third pad 280, the fourth pad 370, the second bump 390, the third redundancy pad 285, the fourth redundancy pad 375, the second redundancy bump 295, and the second interconnection line 260.

The first filler layer 140 and the second filler layer 240 may include, e.g., epoxy resins. In an implementation, each of the first filler layer 140 and the second filler layer 240 may include a filler. The filler may include, e.g., silica. In an implementation, the fillers may each have a size of 0.1 µm to several µm and may have an average size of about 0.3 µm to 1 µm. In an implementation, the first filler layer 140 and the second filler layer 240 may include the filler in an amount of about 55 wt % to 75 wt % with respect to 100 wt % of the first filler layer 140 or the second filler layer 240, respectively.

Hereinafter, various semiconductor packages according to some embodiments will be described with reference to FIGS. 4A to 15.

Figure 4A:
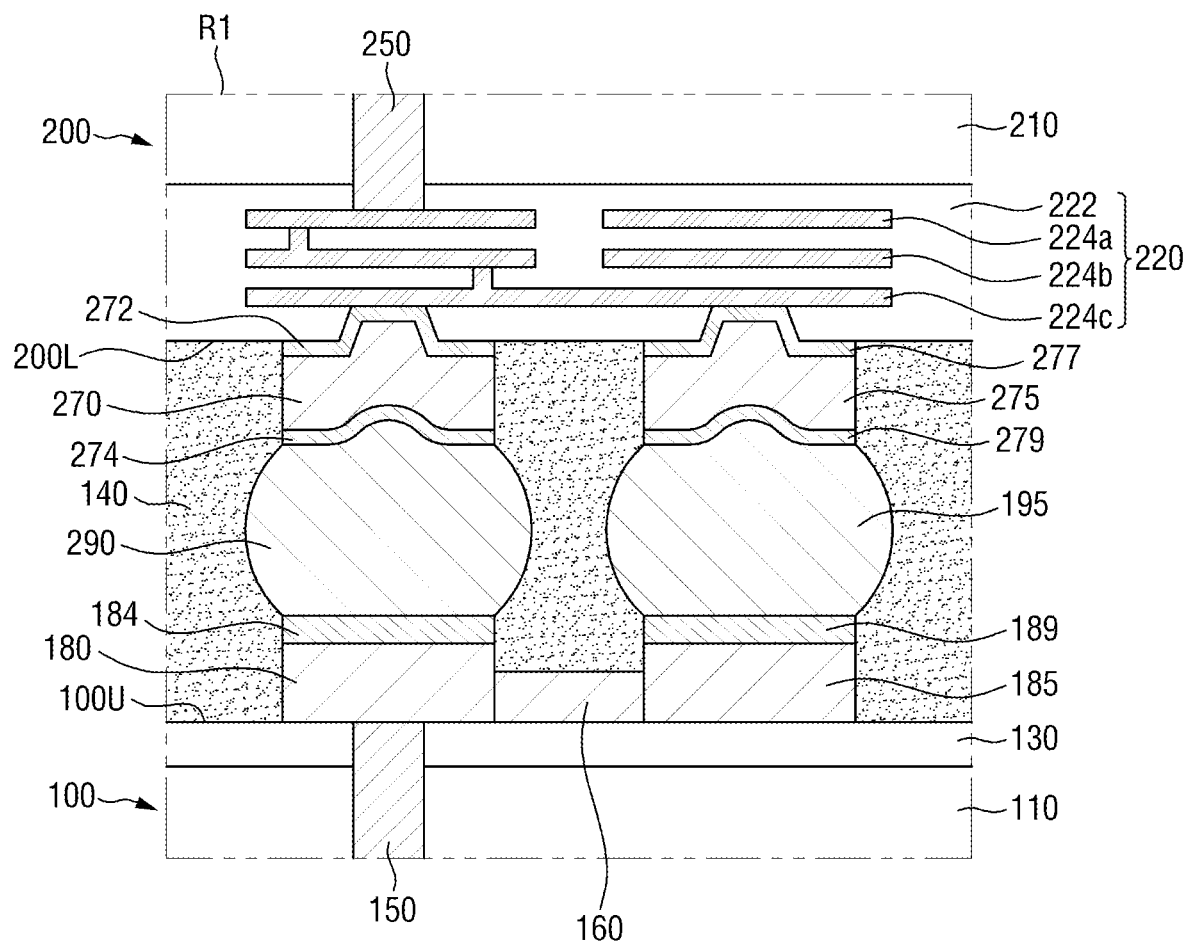
FIGS. 4A and 4B are enlarged views of semiconductor packages according to some embodiments.
Figure 4B:
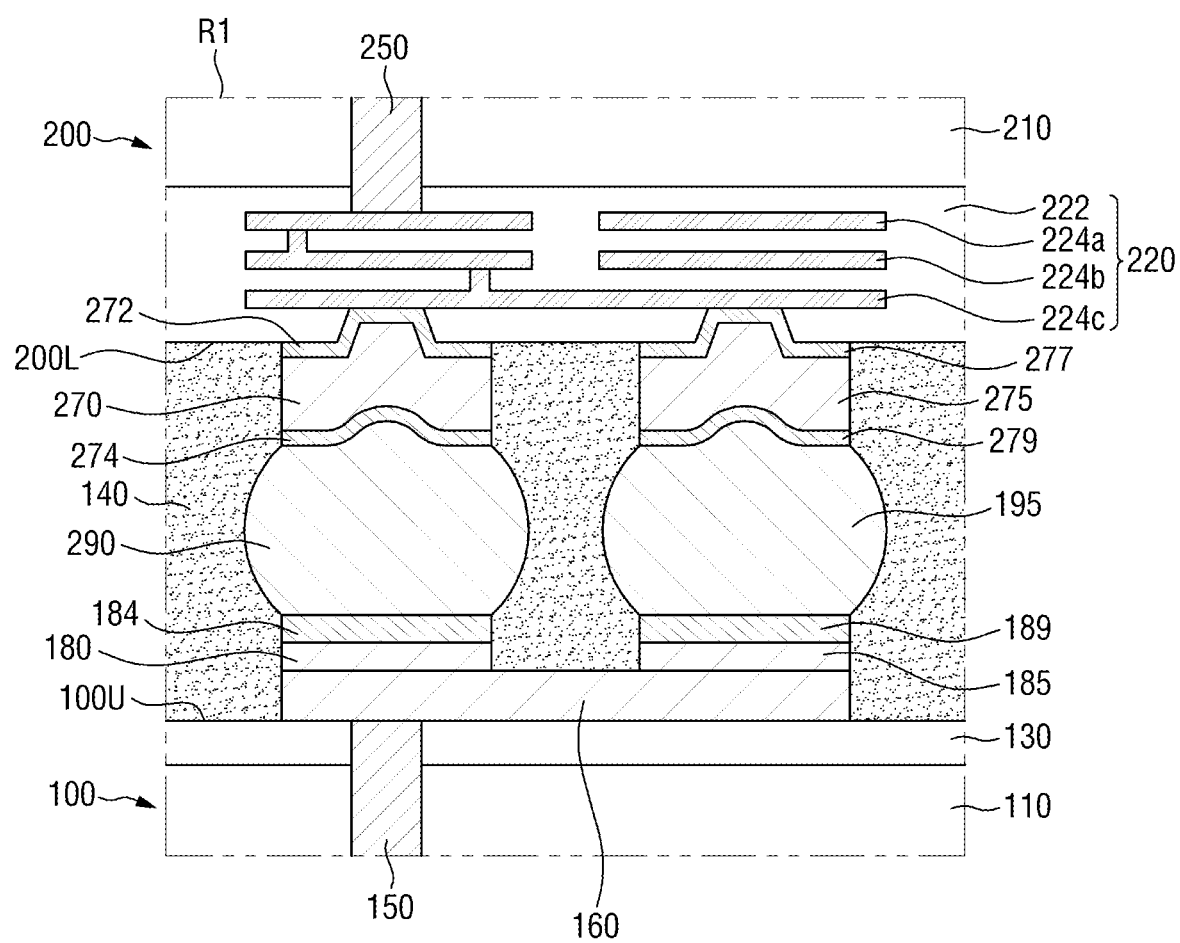

FIGS. 4A and 4B are enlarged views of semiconductor packages according to some embodiments. For convenience of description, parts overlapping with those described above with reference to FIGS. 1 to 3 may be briefly described, or descriptions thereof may be omitted.

Referring to FIG. 4A, a semiconductor package according to some embodiments may further include a first under bump metal layer 184, a second under bump metal layer 274, a third under bump metal layer 189, and a fourth under bump metal layer 279.

The first under bump metal layer 184 may be between the first pad 180 and the first bump 290. In an implementation, the first under bump metal layer 184 may extend along a top surface of the first pad 180. The first under bump metal layer 184 may help improve adhesion between the first pad 180 and the first bump 290 and may help improve the wettability of the first bump 290.

The second under bump metal layer 274 may be between the second pad 270 and the first bump 290. In an implementation, the second under bump metal layer 274 may extend along a bottom surface of the second pad 270. The second under bump metal layer 274 may help improve adhesion between the second pad 270 and the first bump 290 and may help improve the wettability of the first bump 290.

The third under bump metal layer 189 may be between the first redundancy pad 185 and the first redundancy bump 195. In an implementation, the third under bump metal layer 189 may extend along a top surface of the first redundancy pad 185. The third under bump metal layer 189 may help improve adhesion between the first redundancy pad 185 and the first redundancy bump 195 and may help improve the wettability of the first redundancy bump 195. In an implementation, the third under bump metal layer 189 may be at the same level as the first under bump metal layer 184.

The fourth under bump metal layer 279 may be between the second redundancy pad 275 and the first redundancy bump 195. In an implementation, the fourth under bump metal layer 279 may extend along a bottom surface of the second redundancy pad 275. The fourth under bump metal layer 279 may help improve adhesion between the second redundancy pad 275 and the first redundancy bump 195 and may help improve the wettability of the first redundancy bump 195. In an implementation, the fourth under bump metal layer 279 may be at the same level as the second under bump metal layer 274.

Each of the first to fourth under bump metal layers 184, 274, 189, and 279 may be formed of a single layer or may be formed of multiple layers including an adhesive layer and a solder wetting layer.

In an implementation, a first conductive pattern 272 may connect the second pad 270 and the first lines 224a, 224b, and 224c. In an implementation, a trench exposing the lowermost line 224c may be in the first inter-line insulating film 222. The first conductive pattern 272 may extend conformally along the first inter-line insulating film 222 and the trench. The second pad 270 may extend along the first conductive pattern 272.

In an implementation, a second conductive pattern 277 connecting the second redundancy pad 275 and the first lines 224a, 224b, and 224c may be formed. In an implementation, a trench exposing the lowermost line 224c may be in the first inter-line insulating film 222. The second conductive pattern 277 may extend conformally along the first inter-line insulating film 222 and the trench. The second redundancy pad 275 may extend along the second conductive pattern 277. In an implementation, the second conductive pattern 277 may be at the same level as the first conductive pattern 272.

Referring to FIG. 4B, in the semiconductor package according to some embodiments, the first pad 180 and the first redundancy pad 185 may be on a top surface of the first interconnection line 160.

In an implementation, each of the first pad 180 and the first redundancy pad 185 may be in contact (e.g., direct contact) with the top surface of the first interconnection line 160. In an implementation, the height H1 of the first pad 180 and the height H2 of the first redundancy pad 185 may be greater than the height H3 of the first interconnection line 160, on the basis of or when measured from the second surface 100U of the first stack 100 in the third direction Z. For example, a second stack 200-facing surface of the first interconnection line 160 may be closer to the second surface 100U of the first stack 100 in the third direction Z than second stack 200-facing surfaces of the first pad 180 and the first redundancy pad 185 are to the second surface 100U of the first stack 100 in the third direction Z.

Figure 5:
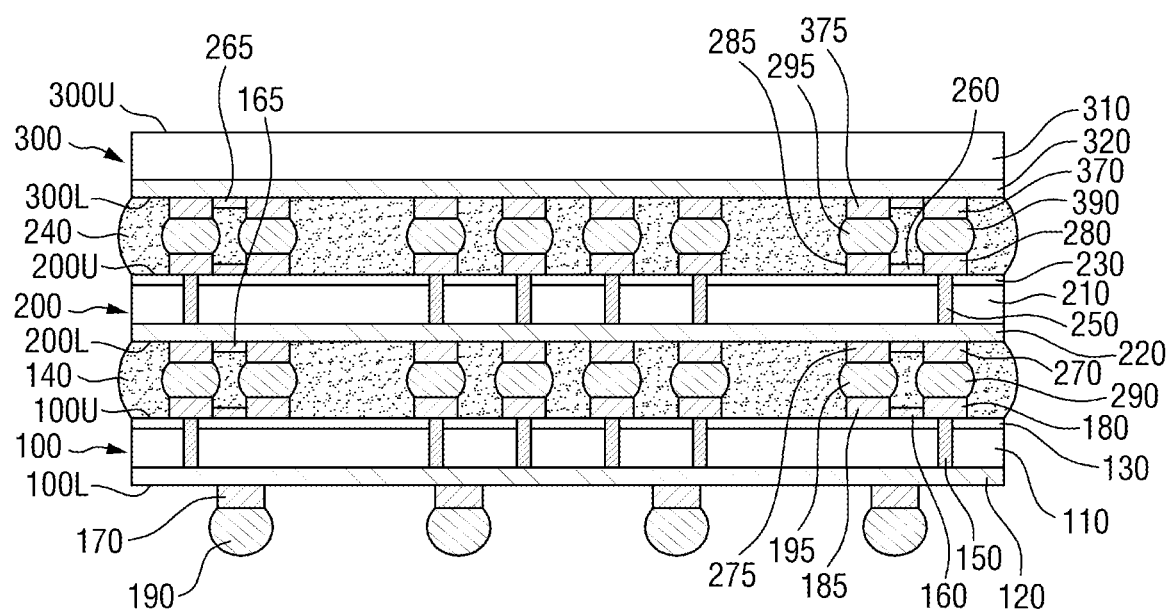
FIG. 5 is a cross-sectional view of a semiconductor package according to some embodiments.

FIG. 5 is a cross-sectional view of a semiconductor package according to some embodiments. For convenience of description, parts overlapping with those described above with reference to FIGS. 1 to 4B may be briefly described, or descriptions thereof may be omitted.

Referring to FIG. 5, the semiconductor package according to some embodiments may further include a third interconnection line 165 and a fourth interconnection line 265.

The third interconnection line 165 may electrically connect the second pad 270 and the second redundancy pad 275. The third interconnection line 165 may extend along the third surface 200L of the second stack 200. In an implementation, the third interconnection line 165 may extend along the bottom surface of the second semiconductor device layer 220 to electrically connect the second pad 270 and the second redundancy pad 275. In an implementation, the third interconnection line 165 may be a RDL on the third surface 200L of the second stack 200.

In an implementation, the electrical connection between the second pad 270 and the second redundancy pad 275 by the second semiconductor device layer 220 may not be made. In an implementation, the second pad 270 and the second redundancy pad 275 may not be connected to the first lines 224a, 224b, and 224c of FIG. 3.

The fourth interconnection line 265 may electrically connect the fourth pad 370 and the fourth redundancy pad 375. The fourth interconnection line 265 may extend along the fifth surface 300L of the third stack 300. In an implementation, the fourth interconnection line 265 may extend along a bottom surface of the third semiconductor device layer 320 to electrically connect the fourth pad 370 and the fourth redundancy pad 375. In an implementation, the fourth interconnection line 265 may be a RDL on the fifth surface 300L of the third stack 300.

In an implementation, the electrical connection between the fourth pad 370 and the fourth redundancy pad 375 by the third semiconductor device layer 320 may not be made.

FIGS. 6 to 11 are layout diagrams of semiconductor packages according to some embodiments. For convenience of description, parts overlapping with those described above with reference to FIGS. 1 to 5 may be briefly described, or descriptions thereof may be omitted.

Figure 6:
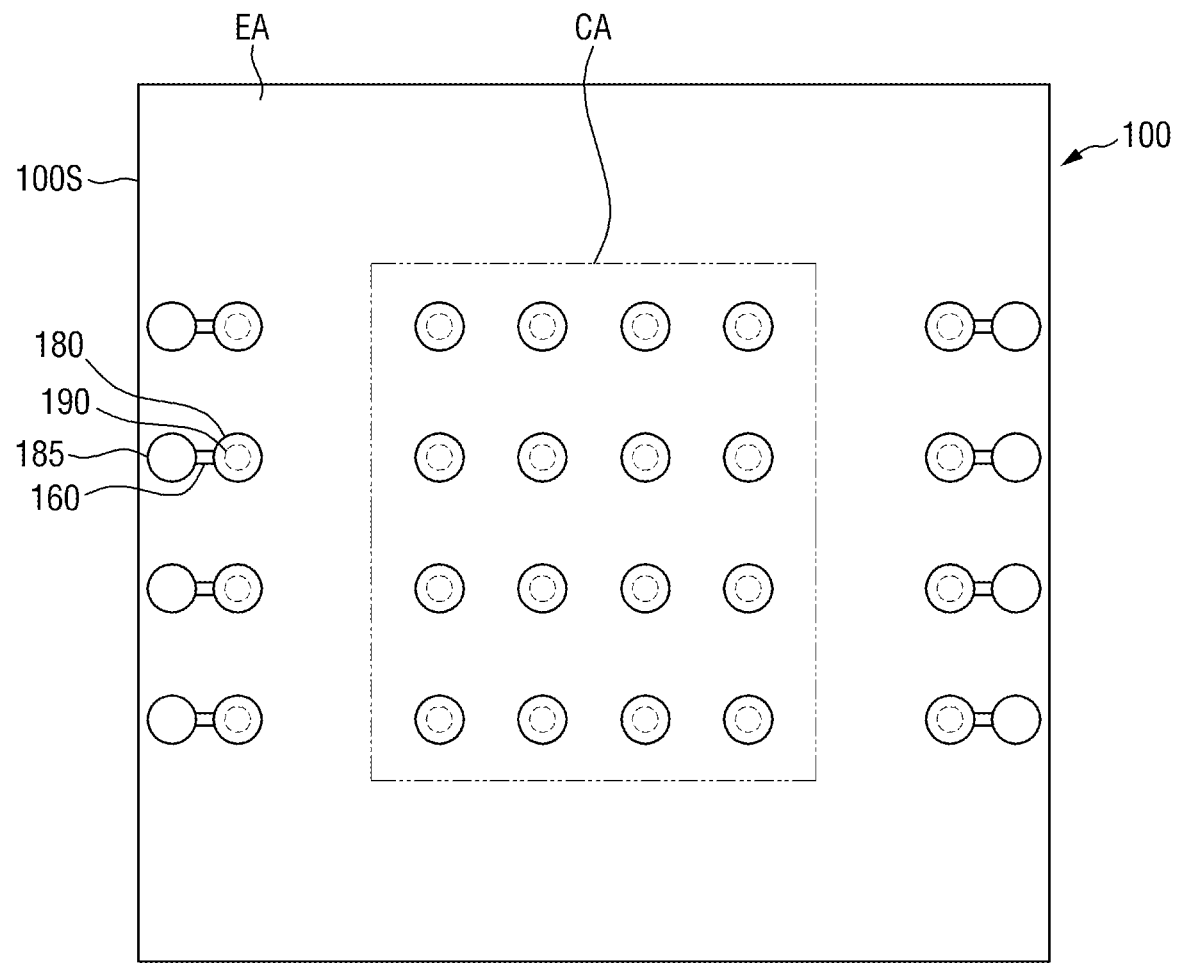

Referring to FIG. 6, in a semiconductor package according to some embodiments, the first redundancy pad 185 may be closer to the edge surface 100S than the first pad 180 is to the edge surface 100S.

In an implementation, the first redundancy pad 185 may be between the edge surface 100S and the first pad 180 (e.g., in the first direction X). In an implementation, the first pad 180 and the first redundancy pad 185 may be arranged to be adjacent to each other in the first direction X on the edge area EA. The first interconnection line 160 may extend in the first direction X on the edge area EA to connect the first pad 180 and the first redundancy pad 185.

Figure 7:
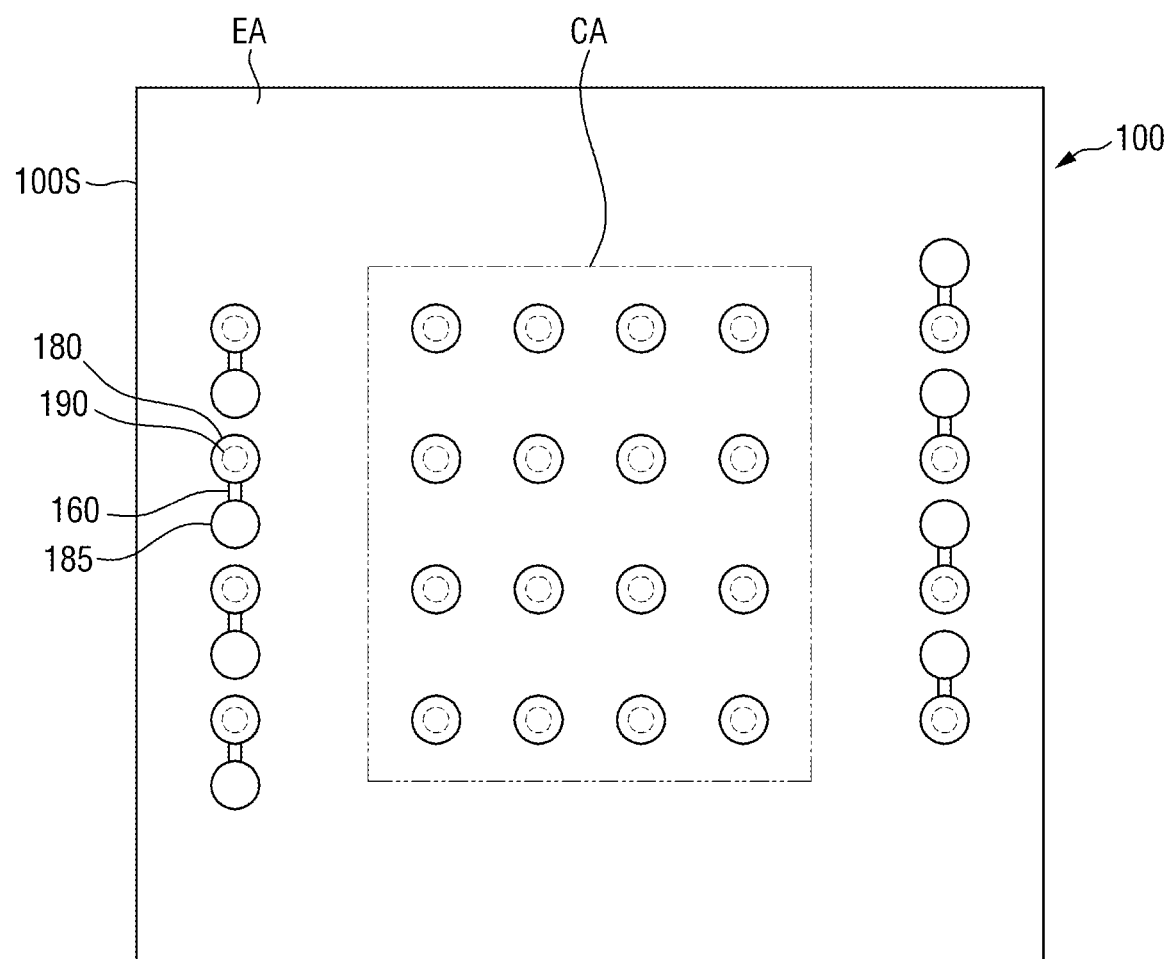

Referring to FIG. 7, in a semiconductor package according to some embodiments, the first pad 180 and the first redundancy pad 185 may be arranged in parallel with the edge surface 100S (e.g., equidistant from the edge surface 100S in the first direction X).

In an implementation, the first pad 180 and the first redundancy pad 185 may be arranged to be adjacent to each other in or aligned along the second direction Y. The first interconnection line 160 may extend in the second direction Y to connect the first pad 180 and the first redundancy pad 185.

Figure 8:
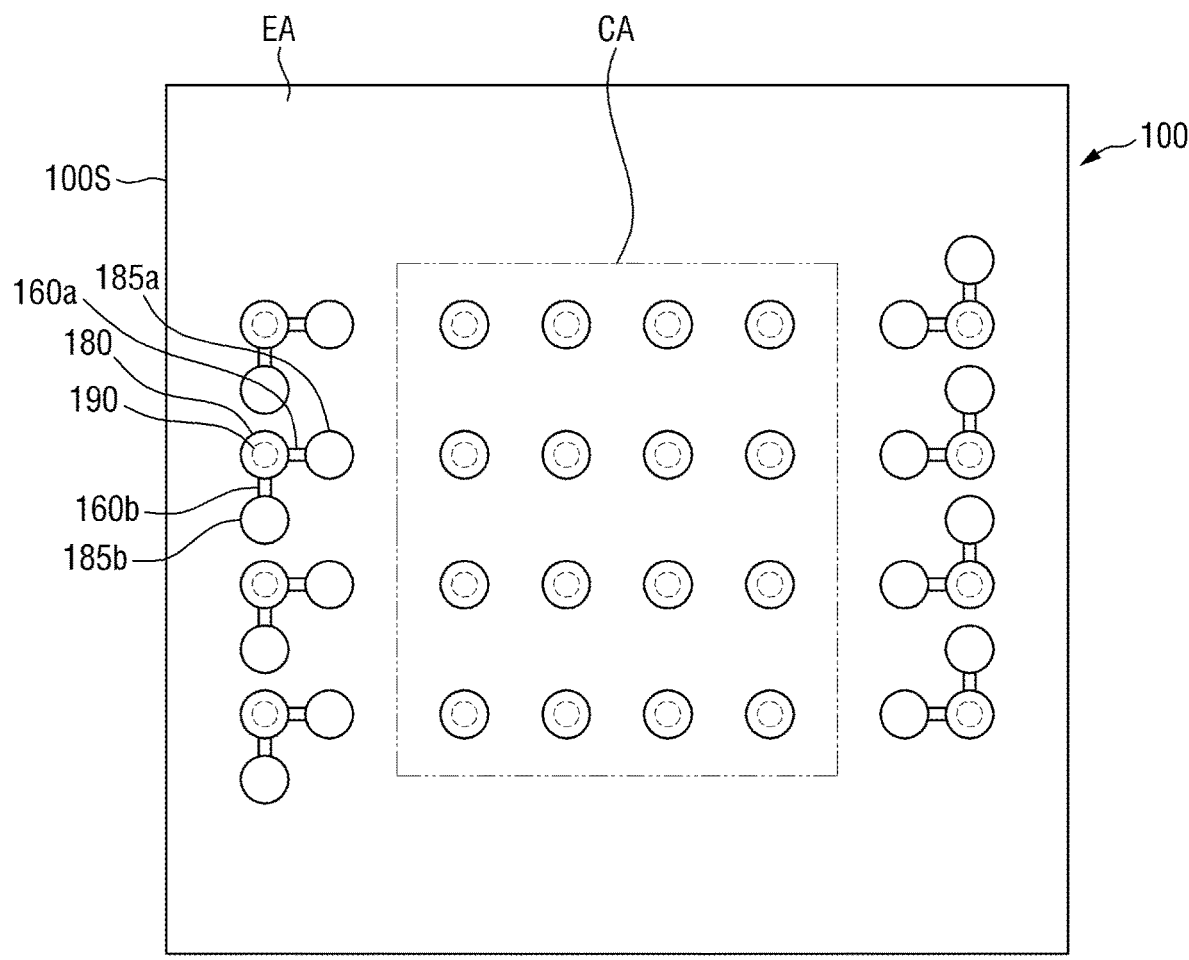

Referring to FIG. 8, in a semiconductor package according to some embodiments, each of the first pads 180 may be connected to a plurality of first redundancy pads 185a and 185b.

In an implementation, the semiconductor package may include a fifth redundancy pad 185a and a sixth redundancy pad 185b, which may be connected to each of the first pads 180. The fifth redundancy pad 185a and the sixth redundancy pad 185b may be spaced apart from each other.

In an implementation, the first pad 180 and the fifth redundancy pad 185a may be arranged to be adjacent to each other in or aligned along the first direction X, and the first pad 180 and the sixth redundancy pad 185b may be arranged to be adjacent to each other in or aligned along the second direction Y.

In an implementation, the semiconductor package may include a fifth interconnection line 160a connecting the first pad 180 and the fifth redundancy pad 185a and a sixth interconnection line 160b connecting the first pad 180 and the sixth redundancy pad 185b. In an implementation, the fifth interconnection line 160a may extend in the first direction X to connect the first pad 180 and the fifth redundancy pad 185a, and the sixth interconnection line 160b may extend in the second direction Y to connect the first pad 180 and the sixth redundancy pad 185b.

Referring to FIG. 9, in a semiconductor package according to some embodiments, each of the first pads 180 may be connected to three first redundancy pads 185a, 185b, and 185c or more.

In an implementation, the semiconductor package may include a seventh redundancy pad 185c connected to the first pad 180. The seventh redundancy pad 185c may be spaced apart from the fifth redundancy pad 185a and the sixth redundancy pad 185b.

In an implementation, the first pad 180 and the seventh redundancy pad 185c may be arranged to be adjacent to each other in a direction different from the first direction X and the second direction Y (e.g., a diagonal direction). In an implementation, the seventh redundancy pad 185c may be arranged with the fifth redundancy pad 185a in the first direction X and may be arranged with the sixth redundancy pad 185b in the second direction Y.

In an implementation, the semiconductor package may include a seventh interconnection line 160c connecting the first pad 180 and the seventh redundancy pad 185c. In an implementation, the seventh interconnection line 160c may extend in a direction different from the first direction X and the second direction Y (e.g., a diagonal direction) to connect the first pad 180 and the seventh redundancy pad 185c.

Figure 10:
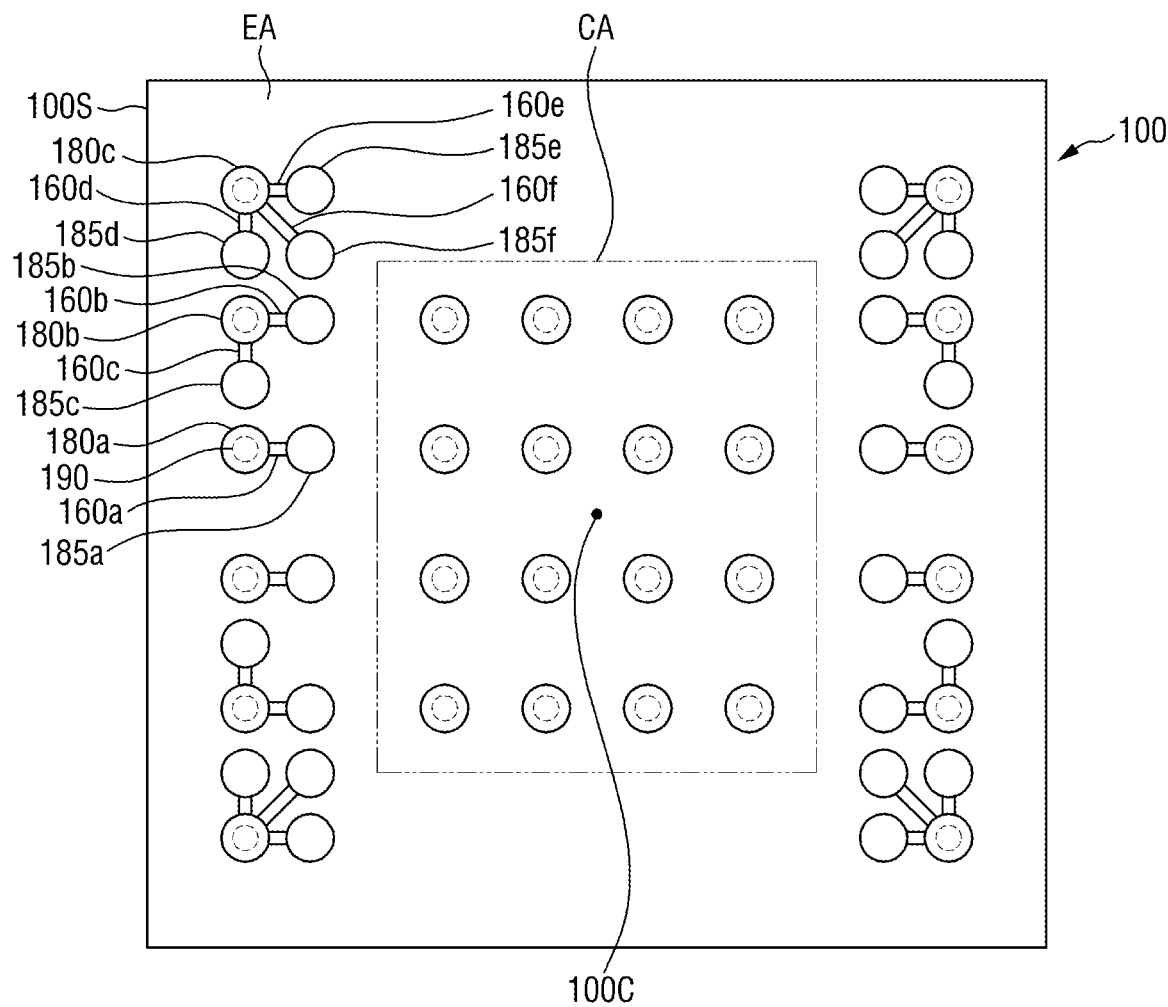

Referring to FIG. 10, in a semiconductor package according to some embodiments, the number of first redundancy pads 185a, 185b, 185c, 185d, 185e, and 185f connected to each of the first pads 180a, 180b, and 180c may increase as a distance from a center 100C of the first stack 100 increases in a plan view.

In an implementation, the semiconductor package may include fifth to seventh pads 180a, 180b, and 180c on the first stack 100.

A distance from the center 100C of the first stack 100 to the sixth pad 180b may be greater than a distance from the center 100C of the first stack 100 to the fifth pad 180a. In an implementation, the number of the first redundancy pads connected to the sixth pad 180b may be greater than the number of the first redundancy pads connected to the fifth pad 180a. In an implementation, the fifth pad 180a may be connected to one first redundancy pad (e.g., the fifth redundancy pad 185a), and the sixth pad 180b may be connected to two first redundancy pads (e.g., the sixth redundancy pad 185b and the seventh redundancy pad 185c).

In an implementation, a distance from the center 100C of the first stack 100 to the seventh pad 180c may be greater than the distance from the center 100C of the first stack 100 to the sixth pad 180b. In an implementation, the number of the first redundancy pads connected to the seventh pad 180c may be greater than the number of the first redundancy pads connected to the sixth pad 180b. In an implementation, the sixth pad 180b may be connected to two first redundancy pads (e.g., the sixth redundancy pad 185b and the seventh redundancy pad 185c), and the seventh pad 180c may be connected to three first redundancy pads (e.g., an eighth redundancy pad 185d, a ninth redundancy pad 185e, and a tenth redundancy pad 185f).

In an implementation, the semiconductor package may include an eighth interconnection line 160d connecting the seventh pad 180c and the eighth redundancy pad 185d, a ninth interconnection line 160e connecting the seventh pad 180c and the ninth redundancy pad 185e, and a tenth interconnection line 160f connecting the seventh pad 180c and the tenth redundancy pad 185f.

Figure 11:
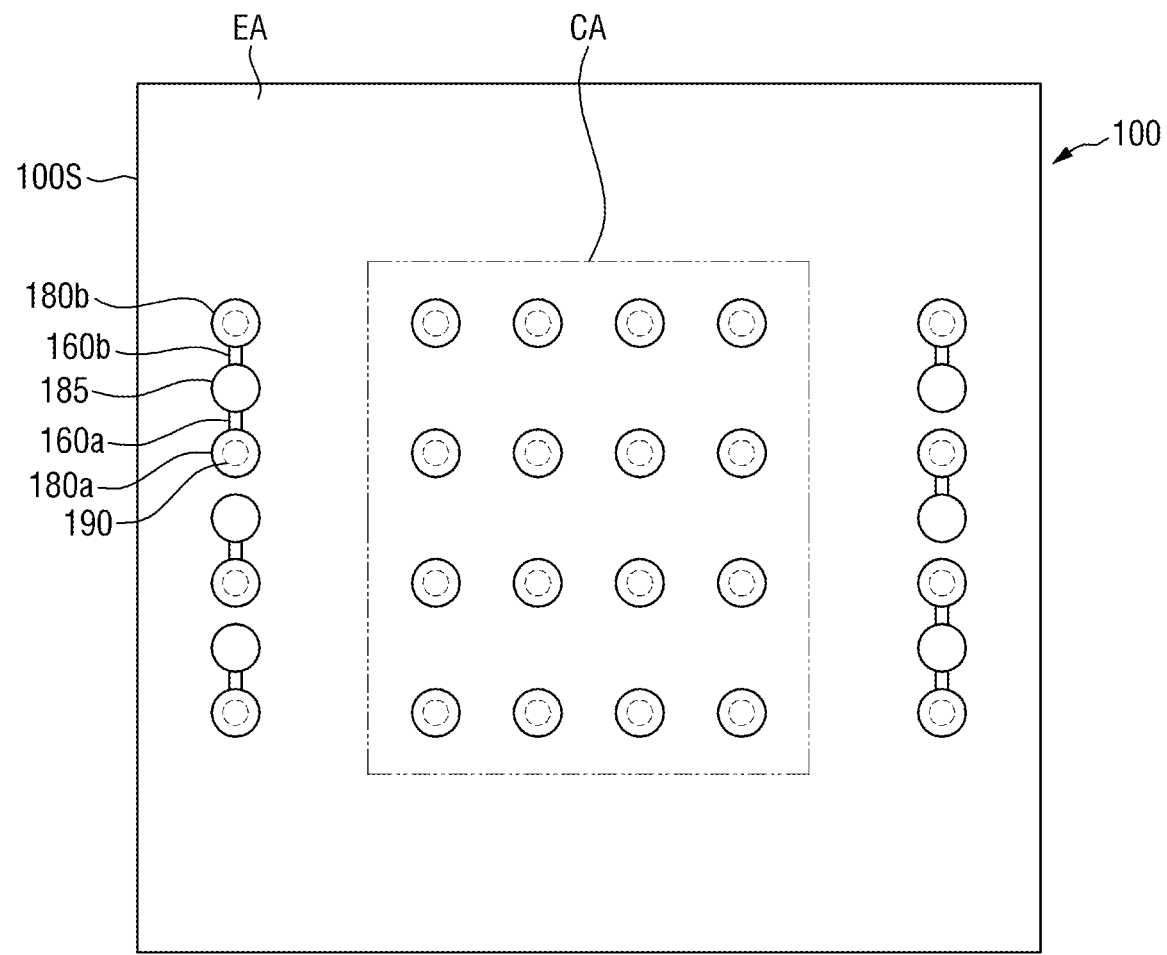

Referring to FIG. 11, in a semiconductor package according to some embodiments, the plurality of first pads 180a and 180b may share the first redundancy pad 185.

In an implementation, the fifth pad 180a and the sixth pad 180b may all be connected to the first redundancy pad 185. The fifth pad 180a and the sixth pad 180b may be spaced apart from each other.

In an implementation, the fifth pad 180a, the first redundancy pad 185, and the sixth pad 180b may be sequentially arranged to be adjacent to each other in the second direction Y.

In an implementation, the fifth interconnection line 160a may connect the first pad 180 and the fifth redundancy pad 185a, and the sixth interconnection line 160b may connect the first pad 180 and the sixth redundancy pad 185b. In an implementation, the fifth interconnection line 160a may extend in the second direction Y to connect the first pad 180 and the fifth redundancy pad 185a, and the sixth interconnection line 160b may extend in the second direction Y to connect the first pad 180 and the sixth redundancy pad 185b.

FIGS. 12 to 15 are cross-sectional views of semiconductor packages according to some embodiments. For convenience of description, parts overlapping with those described above with reference to FIGS. 1 to 11 may be briefly described, or descriptions thereof may be omitted.

Figure 12:
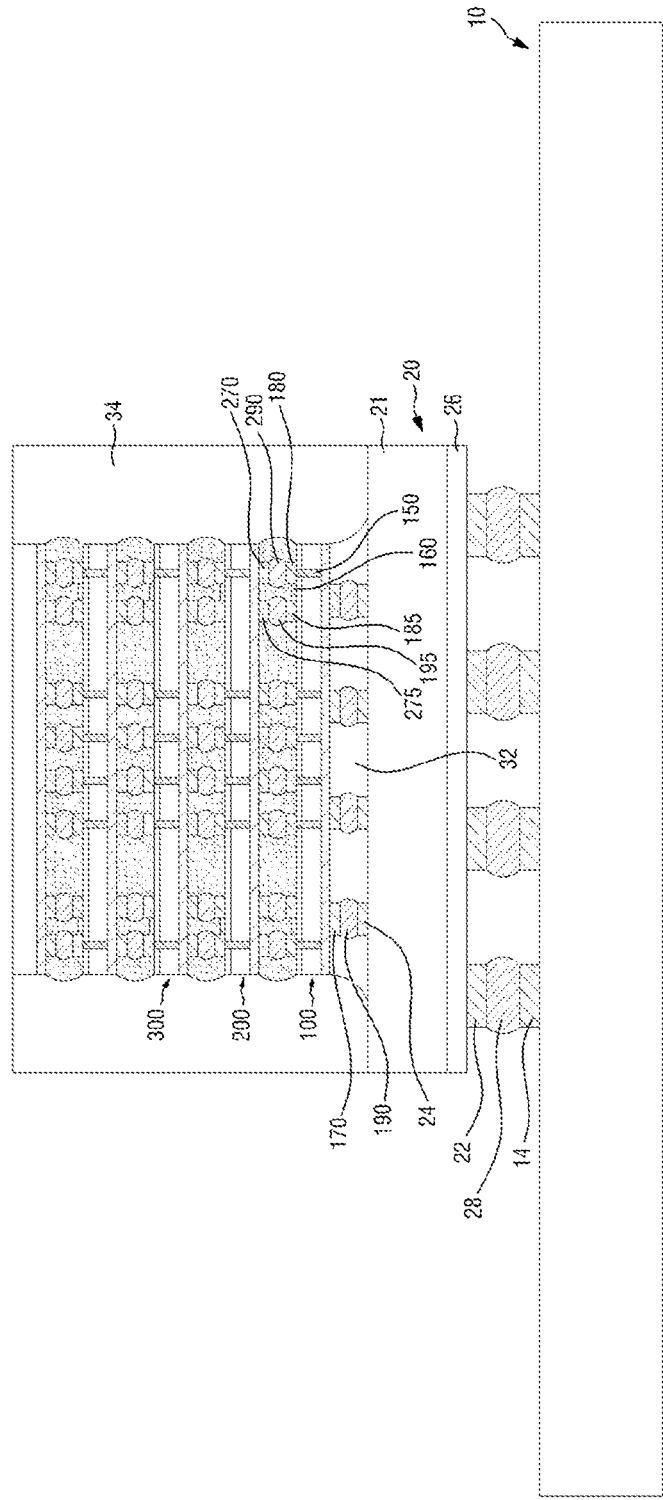
FIGS. 12 to 15 are cross-sectional views of semiconductor packages according to some embodiments.

Referring to FIG. 12, a semiconductor package according to some embodiments may further include a substrate 10 and a semiconductor chip 20.

The substrate 10 may be a substrate for a package. In an implementation, the substrate 10 may be a PCB, a ceramic substrate, or the like. In an implementation, the substrate 10 may be a substrate for a wafer-level package (WLP) manufactured at a wafer level. The substrate 10 may include a bottom surface and a top surface that are opposite to each other.

The semiconductor chip 20 may be on the substrate 10. The semiconductor chip 20 may be an integrated circuit (IC) in which more than several hundreds to several millions of semiconductor devices are integrated into one chip. In an implementation, the semiconductor chip 20 may be an application processor (AP) such as a central processing unit (CPU), a graphic processing unit (GPU), a field-programmable gate array (FPGA), a digital signal processor, a cryptographic processor, a microprocessor, a microcontroller, or the like. In an implementation, the semiconductor chip 20 may be a logic chip such as an analog-to-digital converter (ADC), an application-specific IC (ASIC), or the like and may be a memory chip such as a volatile memory (e.g., a DRAM), a non-volatile memory (e.g., a read only memory (ROM) or a flash memory), or the like. In an implementation, the semiconductor chip 20 may be formed by combining these chips with each other.

The semiconductor chip 20 may be stacked on the top surface of the substrate 10. In an implementation, a substrate pad 14 may be on the top surface of the substrate 10, and a first chip pad 22 may be on a bottom surface of the semiconductor chip 20. The substrate pad 14 and the first chip pad 22 may be connected by a third bump 28. In an implementation, the substrate 10 and the semiconductor chip 20 may be electrically connected to each other.

In an implementation, the first stack 100 may be stacked on the semiconductor chip 20. In an implementation, a second chip pad 24 may be on a top surface of the semiconductor chip 20. The second chip pad 24 and the base pad 170 may be connected by the base bump 190. In an implementation, the semiconductor chip 20 and the first stack 100 may be electrically connected to each other.

Figure 13:
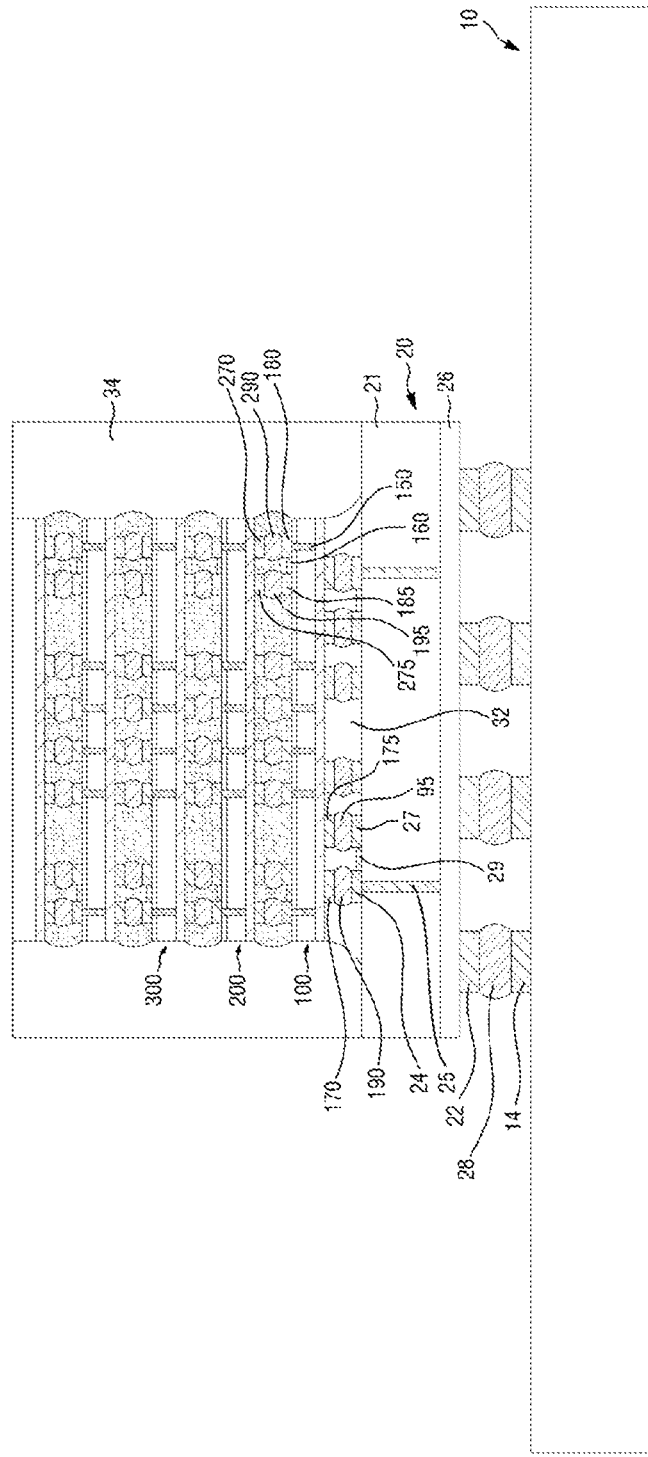

Referring to FIG. 13, a semiconductor package according to some embodiments may further include a third TSV 25.

In an implementation, the semiconductor chip 20 may include a fourth semiconductor substrate 21 and a line layer 26. The third TSV 25 may pass through the fourth semiconductor substrate 21. In an implementation, the second chip pad 24 may be in contact with the third TSV 25. In an implementation, the second chip pad 24 may be in contact with the third TSV 25 exposed from or at the top surface of the semiconductor chip 20 through the fourth semiconductor substrate 21.

In an implementation, an eleventh redundancy pad 27, a twelfth redundancy pad 175, and a third redundancy bump 95 may be formed.

The eleventh redundancy pad 27 may be on the top surface of the semiconductor chip 20. The eleventh redundancy pad 27 may be spaced apart from the second chip pad 24. In an implementation, the eleventh redundancy pad 27 may not be in contact with the third TSV 25. The eleventh redundancy pad 27 may be electrically connected to the second chip pad 24. In an implementation, the second chip pad 24 and the eleventh redundancy pad 27 may be electrically connected by an eleventh interconnection line 29. In an implementation, the eleventh interconnection line 29 may extend along the top surface of the semiconductor chip 20.

The twelfth redundancy pad 175 may be on the bottom surface of the first stack 100. The twelfth redundancy pad 175 may be spaced apart from the base pad 170. The twelfth redundancy pad 175 may be electrically connected to the base pad 170. In an implementation, the base pad 170 and the twelfth redundancy pad 175 may be electrically connected by the first semiconductor device layer 120.

The third redundancy bump 95 may be between the eleventh redundancy pad 27 and the twelfth redundancy pad 175. The third redundancy bump 95 may have various shapes, e.g., a pillar structure, a ball structure, or a solder layer. The third redundancy bump 95 may electrically connect the eleventh redundancy pad 27 and the twelfth redundancy pad 175.

Figure 14:
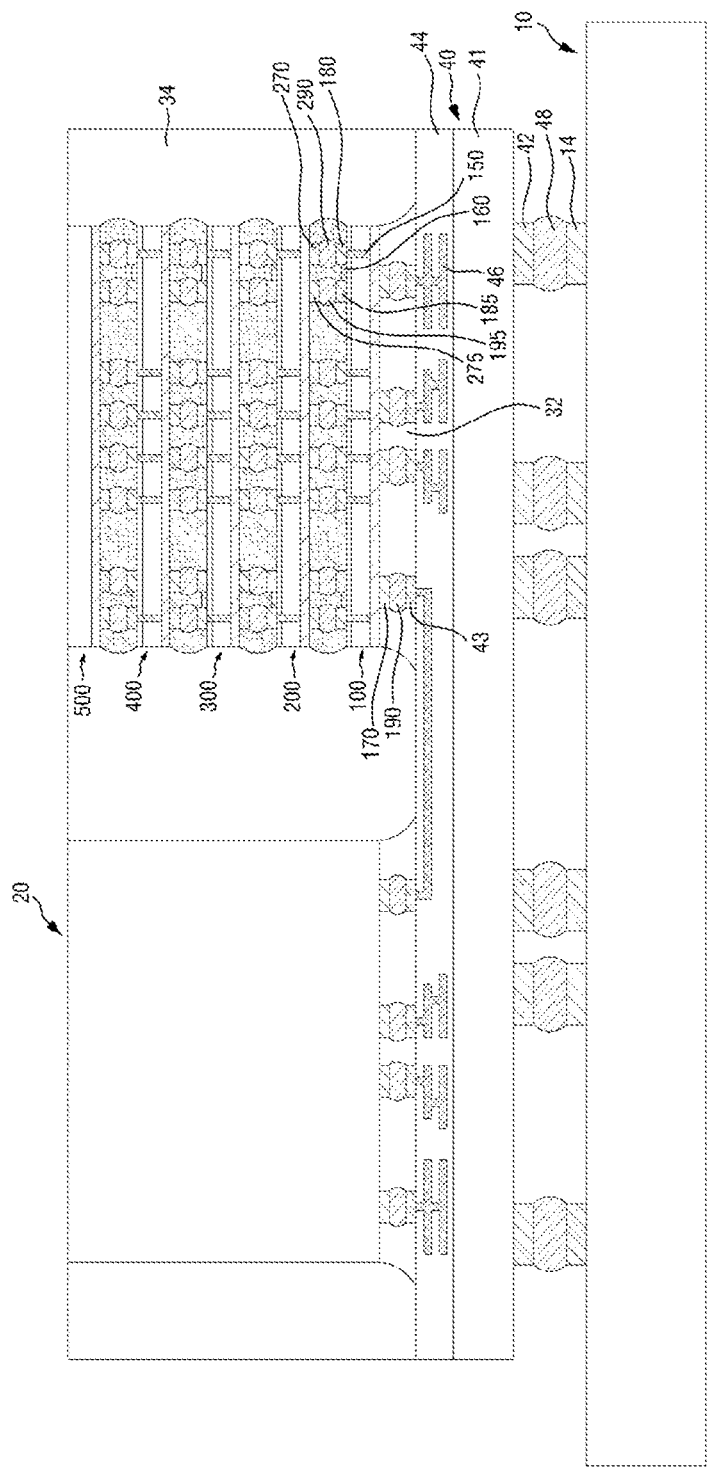

Referring to FIG. 14, a semiconductor package according to some embodiments may further include an interposer 40.

The interposer 40 may be between the substrate 10 and the first stack 100. In an implementation, the interposer 40 may be stacked on the top surface of the substrate 10. In an implementation, a first interposer pad 42 may be on a bottom surface of the interposer 40. The substrate pad 14 and the first interposer pad 42 may be connected by a fourth bump 48. In an implementation, the substrate 10 and the interposer 40 may be electrically connected to each other.

In an implementation, the first stack 100 may be stacked on the interposer 40. In an implementation, a second interposer pad 43 may be on a top surface of the interposer 40. The second interposer pad 43 and the base pad 170 may be connected by the base bump 190. In an implementation, the interposer 40 and the first stack 100 may be electrically connected to each other.

In an implementation, the first stack 100 and the semiconductor chip 20 may be stacked in series on the top surface of the interposer 40. The interposer 40 may facilitate a connection between the substrate 10 and the first stack 100 or a connection between the semiconductor chip 20 and the first stack 100. In an implementation, the interposer 40 may help reduce or prevent a warpage phenomenon of the semiconductor package.

In an implementation, the interposer 40 may include a fifth semiconductor substrate 41, a second inter-line insulating film 44, and second lines 46 in the second inter-line insulating film 44. The second lines 46 may be stacked from a top surface of the fifth semiconductor substrate 41. In an implementation, some lines of the second lines 46 may connect the substrate 10 and the first stack 100, and some other lines of the second lines 46 may connect the semiconductor chip 20 and the second stack 200.

Figure 15:
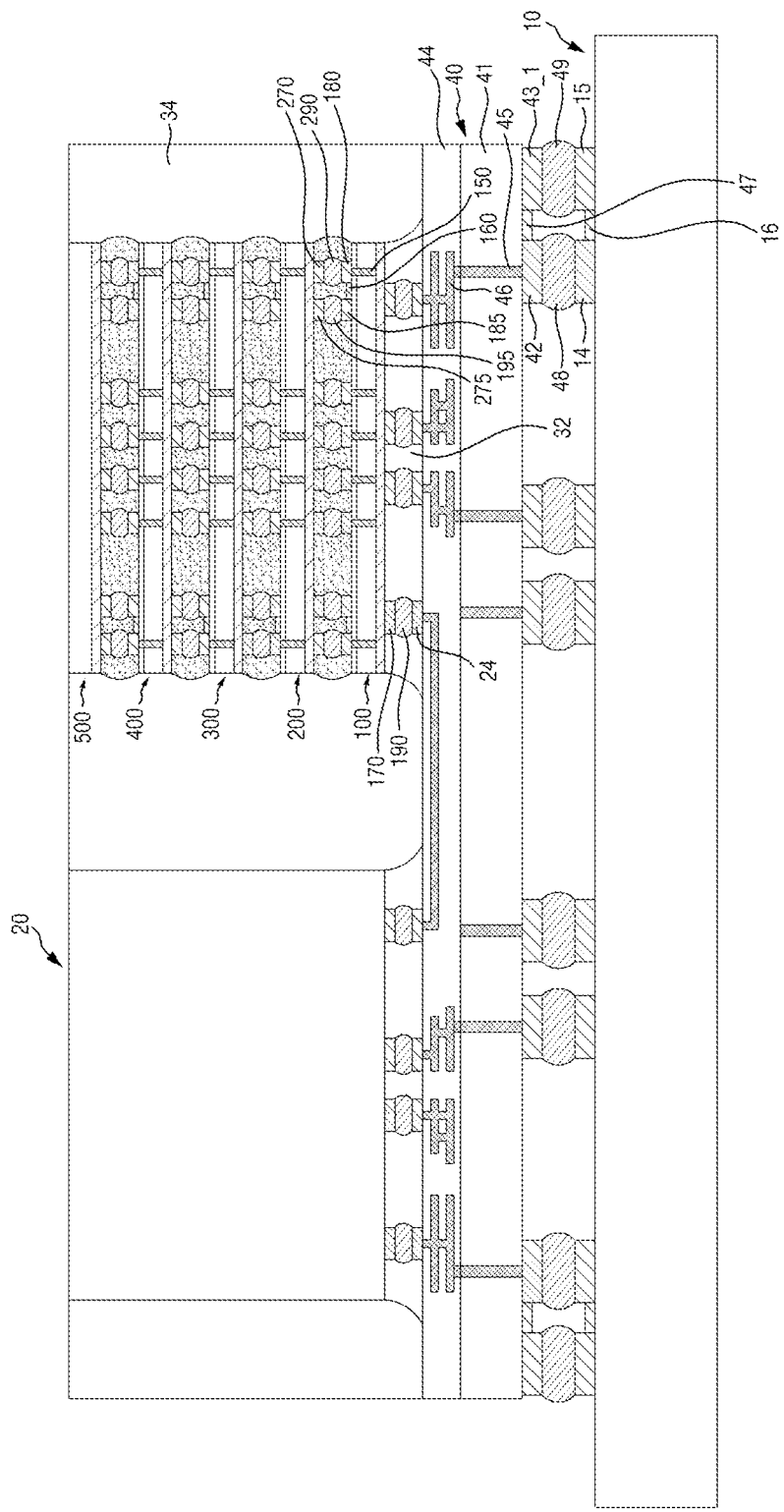

Referring to FIG. 15, a semiconductor package according to some embodiments may further include a fourth TSV 45.

The fourth TSV 45 may pass through the fifth semiconductor substrate 41. In an implementation, the first interposer pad 42 may be in contact with the fourth TSV 45. In an implementation, the first interposer pad 42 may be in contact with the fourth TSV 45 exposed from or at the bottom surface of the interposer 40 through the fifth semiconductor substrate 41.

In an implementation, the semiconductor package may include a thirteenth redundancy pad 15, a fourteenth redundancy pad 43_1, and a fourth redundancy bump 49.

The thirteenth redundancy pad 15 may be on the top surface of the substrate 10. The thirteenth redundancy pad 15 may be spaced apart from the substrate pad 14. The thirteenth redundancy pad 15 may be electrically connected to the substrate pad 14. In an implementation, the substrate pad 14 and the thirteenth redundancy pad 15 may be electrically connected by a twelfth interconnection line 16. The twelfth interconnection line 16 may extend, e.g., along the top surface of the substrate 10.

The fourteenth redundancy pad 43_1 may be on the bottom surface of the interposer 40. The fourteenth redundancy pad 43_1 may be spaced apart from the first interposer pad 42. In an implementation, the fourteenth redundancy pad 43_1 may not be in contact with the fourth TSV 45. The fourteenth redundancy pad 43_1 may be electrically connected to the first interposer pad 42. In an implementation, the first interposer pad 42 and the fourteenth redundancy pad 43_1 may be electrically connected by a thirteenth interconnection line 47. The thirteenth interconnection line 47 may extend, e.g., along the bottom surface of the interposer 40.

The fourth redundancy bump 49 may be between the thirteenth redundancy pad 15 and the fourteenth redundancy pad 43_1. The fourth redundancy bump 49 may have various shapes, e.g., a pillar structure, a ball structure, or a solder layer. The fourth redundancy bump 49 may electrically connect the thirteenth redundancy pad 15 and the fourteenth redundancy pad 43_1.

By way of summation and review, a semiconductor chip in which through-silicon vias (TSVs) are formed and a multi-chip semiconductor package in which a plurality of the semiconductor chips are stacked have been considered.

One or more embodiments may provide a semiconductor package including through-silicon vias (TSVs).

One or more embodiments may provide a semiconductor package having improved product reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A semiconductor package, comprising:
a first stack including a first semiconductor substrate;
a plurality of first through-silicon vias (TSVs) passing through the first semiconductor substrate;
a second stack on the first stack, the second stack including a second surface facing a first surface of the first stack;
a first pad on the first surface of the first stack, the first pad being in contact with one or more first TSVs of the plurality of first TSVs;
a second pad on the first surface of the first stack, the second pad being adjacent to the first pad and not being in contact with the plurality of first TSVs;
an interconnection line on the first surface of the first stack, the interconnection line connecting the first pad and the second pad;
a first bump on the first pad;
a third pad on the second surface of the second stack, the third pad being on the first bump;
a second bump on the second pad; and
a fourth pad on the second surface of the second stack, the fourth pad being on the second bump;
wherein the first pad and the second pad are in direct contact with the interconnection line.
2. The semiconductor package as claimed in claim 1, wherein the second pad does not overlap with the plurality of first TSVs.
3. The semiconductor package as claimed in claim 1, further comprising a second TSV passing through a second semiconductor substrate,
wherein:
the second stack includes the second semiconductor substrate,
the first pad overlaps with the second TSV, and
the second pad does not overlap with the second TSV.
4. The semiconductor package as claimed in claim 1, wherein the first bump and the second bump are not in contact with each other.
5. The semiconductor package as claimed in claim 1, wherein:
the first pad and the second pad are at a same level,
the third pad and the fourth pad are at a same level, and
the first bump and the second bump are at a same level.
6. The semiconductor package as claimed in claim 1, wherein:
the interconnection line is between the first pad and the second pad,
a bottom surface of the first pad, a bottom surface of the second pad, and a bottom surface of the interconnection line are placed on the same plane,
a height of the first pad is greater than a height of the interconnection line, as measured from the first surface, and
a height of the second pad is greater than the height of the interconnection line, as measured from the first surface.
7. The semiconductor package as claimed in claim 1, wherein the first pad and the second pad are on the interconnection line and overlap with the interconnection line.

8. The semiconductor package as claimed in claim 7, wherein a height of the interconnection line is greater than a height of the first pad and a height of the second pad.

9. The semiconductor package as claimed in claim 1, wherein a distance at which the first pad is spaced apart from the second pad is in a range of 3 µm to 8 µm.

10. The semiconductor package as claimed in claim 1, wherein:
the third pad and the fourth pad are spaced apart from each other,
the second stack includes a second semiconductor substrate and a semiconductor device layer on the second semiconductor substrate, and
the semiconductor device layer connects the third pad and the fourth pad.

11. The semiconductor package as claimed in claim 1, further comprising an under bump metal layer between the first pad and the first bump, the under bump metal layer extending along a surface of the first pad.

12. The semiconductor package as claimed in claim 1, further comprising an under bump metal layer between the third pad and the first bump, the under bump metal layer extending along a surface of the third pad.

13. The semiconductor package as claimed in claim 1, further comprising a filler layer between the first stack and the second stack; wherein the filler layer covers an upper surface of the interconnection line.

14. A semiconductor package, comprising:
a first stack including a first semiconductor substrate;
a plurality of first through-silicon vias (TSVs) passing through the first semiconductor substrate;
a second stack on the first stack, the second stack including a second surface facing a first surface and including a semiconductor device layer;
a first pad on the first surface of the first stack, the first pad being in contact with one or more first TSVs of the plurality of first TSVs;
a second pad on the first surface of the first stack, the second pad being adjacent to the first pad and not being in contact with the plurality of first TSVs;
a third pad on the second surface, the third pad overlapping the first pad;
a fourth pad on the second surface, the fourth pad overlapping the second pad;
a first bump between the first pad and the third pad; and
a second bump between the second pad and the fourth pad, and the second bump are spaced apart from the first bump,
wherein:
the semiconductor device layer includes an insulating film and metal lines, and
the third pad and the fourth pad are connected with the metal lines.

15. The semiconductor package as claimed in claim 14, further comprising an interconnection line on the first surface of the first stack, the interconnection line connecting the first pad and the second pad;
wherein the first pad and the second pad are in direct contact with the interconnection line.

16. The semiconductor package as claimed in claim 15, wherein the interconnection line is in contact with a side surface of the first pad and a side surface of the second pad.

17. The semiconductor package as claimed in claim 14, wherein a width of the first pad is greater than a width of the plurality of first TSVs.

18. The semiconductor package as claimed in claim 14, wherein a width of the first pad is in a range of 15 µm to 30 µm.

19. A semiconductor package, comprising:
a first stack including a center area and an edge area around the center area, the first stack including a first semiconductor substrate;
a plurality of first TSVs passing through the first semiconductor substrate;
a plurality of first pads on a top surface of the center area, the plurality of first pads being in contact with the plurality of first TSVs;
a second pad on the top surface of the edge area, the second pad being in contact with one first TSV of the plurality of first TSVs;
a third pad on the top surface of the edge area, the third pad being adjacent to the second pad and not being in contact with the plurality of first TSVs;
an interconnection line extending along the top surface of the edge area, the interconnection line being in direct contact with the second pad and the third pad;
a plurality of bumps on the plurality of first pad, the second pad, and the third pad;
a fourth pad on one of the plurality of bumps, the fourth pad overlapping with the second pad;
a fifth pad on one of the plurality of bumps, the fifth pad overlapping with the third pad and being spaced apart from the fourth pad; and
a second stack including a semiconductor device layer including an insulating film and metal lines,
wherein:
the fourth pad and the fifth pad are on a bottom surface of the second stack, and
the fourth pad and the fifth pad are connected with the metal lines of the second stack.

20. The semiconductor package as claimed in claim 19, wherein:
the first semiconductor substrate includes an edge surface extending in a first direction, and
a distance at which the edge area is spaced apart from the edge surface is 200 µm or less.

* * * * *